United States Patent [19]
Donde et al.

[11] Patent Number: 5,788,453
[45] Date of Patent: Aug. 4, 1998

[54] PIEZOELECTRIC WAFER GRIPPING SYSTEM FOR ROBOT BLADES

[75] Inventors: Arik Donde, Austin, Tex.; Herzel Laor, Boulder, Colo.

[73] Assignee: Applied Materials, Inc., Santa Clara, Calif.

[21] Appl. No.: 657,721

[22] Filed: May 30, 1996

[51] Int. Cl.$^6$ .................................................. B25J 15/12
[52] U.S. Cl. ........................... 414/751; 414/941; 901/36
[58] Field of Search ................................. 414/751, 935, 414/936, 941; 901/36

[56] References Cited

U.S. PATENT DOCUMENTS

| | | | |
|---|---|---|---|
| 4,610,475 | 9/1986 | Heiserman | 901/36 |
| 4,642,438 | 2/1987 | Beumer et al. | 414/591 |
| 4,667,997 | 5/1987 | Udagawa et al. | 901/36 |
| 5,100,502 | 3/1992 | Murdoch et al. | 156/643 |
| 5,438,419 | 8/1995 | Lee et al. | 414/754 |
| 5,511,931 | 4/1996 | Arai et al. | 901/28 |
| 5,641,264 | 6/1997 | Kuno et al. | 414/751 |

*Primary Examiner*—David A. Bucci
*Assistant Examiner*—Gregory A. Morse
*Attorney, Agent, or Firm*—Fliesler, Dubb, Meyer & Lovejoy

[57] ABSTRACT

A piezoelectric gripping system firmly secures a semiconductor wafer or other workpiece onto a robotic transfer blade so as to allow for acceleration forces that exceed the frictional holding force between the blade and workpiece. To prevent production of contaminating particulates during grasping, the piezoelectric grippers of the system are independently actuated into slight contact with the workpiece so as to prevent frictional movement of the workpiece relative to the blade during the grasping operation. Once all of the grippers are in slight contact with the workpiece, the voltage to each gripper is increased by a predetermined amount to thereby uniformly increase the force exerted by each gripper on the workpiece and to thereby more firmly secure the workpiece to the blade. Thereafter, the blade may transfer the workpiece at extremely high speeds without the workpiece moving frictionally relative to the blade.

42 Claims, 20 Drawing Sheets

5,788,453

PIEZOELECTRIC WAFER GRIPPING SYSTEM FOR ROBOT BLADES

BACKGROUND OF THE INVENTION

1. Field of the Invention

The present invention relates to wafer handling such as occurs inside semiconductor wafer fabrication equipment, and in particular, to a gripping system for securing wafers for transfer between wafer processing chambers.

2. Description of Related Art

Manufacturers of semiconductor wafers are constantly striving to improve fabrication times. A single wafer may contain hundreds of semiconductor chips worth upwards of $50,000 to $100,000. As such, an increase in yield of even a few wafers per hour would provide significant cost reductions. As illustrated in FIG. 1, a typical semiconductor wafer fabrication process, such as for example, high density plasma (HDP) etching, is carried out in a fabrication process station 20. The station 20 typically includes a plurality of process chambers 22–26 and a robotic transfer mechanism 28 for transferring a semiconductor wafer 30 between the various processing chambers. The wafer 30 (shown inside chamber 22) may include a cut out or flat section 31 for providing information regarding the orientation of the wafer.

Initially, the semiconductor wafer 30 is loaded into the station 20 through a loadlock chamber 22 which acts as a contaminant filter, an intermediate vacuum buffer and a gateway for wafer distribution to the vacuum-related processes. After the loadlock chamber 22 has been sealed and substantially evacuated, the wafer is transferred by the robotic transfer mechanism 28 from the loadlock chamber 22 to an orienting chamber 24. The latter automatically identifies the center of the wafer and moves the wafer into a desired rotational and linear orientation. From the orienting chamber 24, the semiconductor wafer 30 is transferred by the transfer mechanism to a processing chamber 26. A wafer fabrication process, such as HDP etching, is carried out in chamber 26. After the fabrication process is completed, the transfer mechanism transfers the wafer 30 from the process chamber 26 back to the loadlock chamber 22. Chamber 22 then unloads the processed wafer and prepares to receive the next wafer.

Referring now to FIGS. 1–3, the robotic transfer mechanism 28 conventionally includes a blade 32 for supporting the wafer 30 while the wafer is transferred between the various chambers 22–26. Lift pins 22a–22d, 24a–24d, and 26a–26d are provided within the respective chambers and positioned outside of the width of the blade 32 for supporting the wafer 30 within that chamber. Upon delivery of a wafer into a chamber by the blade 32, the lift pins rise vertically to lift the wafer off the blade and the blade then exits the chamber. The pins then lower the wafer onto a chuck. When a process within a chamber is completed, the pins rise again, the blade enters the chamber under the wafer, the lift pins drop, and then the blade 32 exits the chamber with the wafer supported thereon.

The wafer should not move significantly with respect to the blade while the wafer is being transported on the blade. Any frictional, or rubbing, movement of the wafer relative to the blade may generate undesirable particulates that may spread within the chambers 22–26 of the processing station. Defects due to particulate contamination are a major source of yield loss and reduced product reliability in the semiconductor industry. As device geometries continue to shrink, and wafer sizes continue to increase, particulate contamination is becoming a significant factor in device performance.

Wafer transfer blades are conventionally formed with a depression 34 (FIG. 3) in which the wafer 30 is seated during transfer. The depression 34, together with the frictional force between the semiconductor wafer and blade, is intended to prevent relative movement between the wafer and blade.

As described above, the time it takes to fabricate a semiconductor wafer is a critical consideration in the fabrication process. It has been determined that approximately 20% of wafer fabrication processing time is consumed by transfer of the wafer between the various chambers 22–26 within each station 20 while supported on the robotic transfer blade. This time spent by the wafer on the blade is not value added time (i.e., no fabrication processes are carried out on the wafer during this time).

It is therefore desirable to minimize the time which the wafer spends supported on the blade. One way of minimizing this time is by increasing the speed with which the blade moves the wafer. However, there is a critical speed above which the acceleration/deceleration of the blade will generate forces on the wafer that exceed the frictional force holding the wafer stationary on the blade. If the velocity of the blade exceeds this critical speed, the wafer will slip with respect to the blade and possibly generate particulates. In addition to the generation of undesirable particulates, such slippage may result in the wafer being dislocated from the blade.

Attempts have been made to more firmly secure the wafer to the blade during transfer. For example, mechanical chucks have been mounted on the blade. Such chucks include hinged jaws that move inwardly to engage and secure the wafer once the wafer is located on the blade. However, such mechanical gripping systems have several drawbacks. First, the precise location of the wafer on the blade may vary. As the jaws move inward to engage the wafer, unless the wafer is perfectly centered with respect to the movement of all of the jaws, one jaw will engage the wafer before the others. As the first-engaging jaw continues to move inward, the jaw causes the wafer to move relative to the blade, thereby bringing about the very condition the chuck was intended to prevent. Second, such mechanical gripping systems inherently have a first moving part (i.e., the hinged jaws) moving in frictional, rubbing contact with respect to a second stationary part (i.e., the support on which the jaws are mounted) Such relative frictional movement of a first part with respect to a second part tends to generate particulates that adversely affect wafer fabrication.

Some mechanical grippers employ spring loaded chucks (FIG. 4) in which a spring is expanded/compressed upon contact with a wafer. In the spring loaded chuck system shown in FIG. 4, after contact of a jaw 36 with the edge of the wafer 30, a spring 38 will expand upon further movement of the jaw support 40, until spring 38 exerts a force on the jaw 36 sufficient to move the wafer with respect to the blade 32. Presumably before this point, the other jaws of the spring loaded chuck system will have already engaged the wafer around the periphery of the wafer. A problem with such systems is that the force exerted by a spring upon expansion/compression is not linear and a net resultant force may still be exerted on the wafer after all the spring loaded jaws have engaged the wafer, thereby causing the wafer to move with respect to the blade. Additionally, spring loaded chucks also include parts which move in frictional contact with each other, thereby providing another source of contaminants.

A further disadvantage to conventional transfer blades 32 is that a wafer 30 may be seated unevenly in the blade depression 34 as shown in FIG. 3A. An improper seating of a wafer within the depression 34 may result in significant damage or complete ruin of the wafer.

SUMMARY OF THE INVENTION

In accordance with an embodiment of the present invention, a system of two or more shape-changing grippers such as piezoelectric or bimettalic grippers are provided for securing wafers during high speed transfer. In one embodiment of the invention, each of plural piezoelectric grippers is comprised of two layers of piezoelectric ceramic material interspersed between three electrically conductive electrode layers. The piezoelectric grippers are mounted on respective support blocks, which support blocks are mounted in and project above the blade surface. The grippers are mounted on the support blocks so as to be slightly spaced away from the surface of the blade such that the grippers are free to move without contacting or rubbing against the blade. The piezoelectric grippers are oriented so as to be symmetrically spaced around the outer circumference of the wafer. Each of the piezoelectric grippers is electrically coupled to a controllable, electrical power source, which power source is responsive to a computer that controls the operation of the grippers and the transfer mechanism.

Once a wafer is supported on the blade, successive amounts of incremental voltage are applied to the piezoelectric ceramic layers of each gripper via the electrode layers. In one embodiment of the invention, upon application of the incremental voltage, each gripper bends in a direction generally toward the center of the wafer. As it is unlikely that a wafer is perfectly centered with respect to each of the piezoelectric grippers, the piezoelectric grippers will usually engage the outer circumference of the wafer at different times. When one of the piezoelectric grippers comes into measurable contact with the edge of the wafer, the wafer will exert a counter force on that piezoelectric gripper. The counter force in turn generates a voltage within the ceramic layers of the gripper.

Electronic sensors are provided connected to the ceramic layers for sensing the voltage generated within the ceramic layers as a result of the initial wafer contact. Once the sensor of the gripper detects a voltage, the sensor sends a signal to the computer to stop incrementing the source voltage applied to the piezoelectric gripper and to keep the applied voltage constant. In this way, each piezoelectric gripper will bend toward the wafer until it engages the wafer, at which point further bending of the piezoelectric gripper substantially ceases. As a result of the extreme sensitivity of piezoelectric materials used in the grippers, a very slight, measurable contact force between each of the grippers and the wafer may be sensed by the sensor to stop further bending of the grippers.

In an embodiment of the invention, once each of the piezoelectric grippers has come into initial contact with the wafer, the source voltage applied to each of the grippers is simultaneously increased by a predetermined amount thereby resulting in the piezoelectric grippers firmly securing the wafer on the blade. Once firmly secured on the blade, the blade may transfer the semiconductor wafer between the various chambers within the processing station at speeds significantly above those possible with the wafer simply resting on the blade.

In one embodiment, a single voltage source may be mounted on the blade for providing voltage to an electrical control circuit adjacent each of the grippers. Where the voltage source is mounted on the blade, signals may be transferred between the voltage source and the electrical control circuit via flexible or non-flexible electrical leads. Alternatively, the voltage source may be a power supply mounted remotely from the piezoelectric gripper and blade, and connected to each electrical control circuit via flexible electrical leads. Control and sensor feedback signals may be transferred between the electrical control circuit and the computer via flexible electrical leads. Alternatively, the control and feedback signals may be transferred via optical means. In one such embodiment employing optical means, infrared signals may be transferred between a first infrared signal transmitter/receiver mounted adjacent a particular gripper on the blade, and a second infrared signal transmitter/receiver mounted outside of the processing station and connected to the computer. Using an infrared transmission system offers the advantage that the electrical leads for transferring signals between the electrical control circuit and computer may be omitted from within the environment of the processing equipment, which environment may corrode the electrical leads over time.

BRIEF DESCRIPTION OF THE DRAWINGS

The invention will now be described with reference to the accompanying drawings in which.

DETAILED DESCRIPTION

Embodiments in accordance with the present invention will now be described with reference to FIGS. 5–15 which, in general, relate to a piezoelectric gripping system for firmly securing a semiconductor wafer onto a robot transfer mechanism blade during transfer of the semiconductor wafer between wafer fabrication processing chambers. While these embodiments of the present invention are described with respect to the gripping of semiconductor wafers, it is understood the present invention may be used to grip other objects for transport through processes where particulate generation is a consideration. The term "wafer" as used herein refers to a workpiece as it may exist in any of the various stages of the fabrication process.

Figure 5:
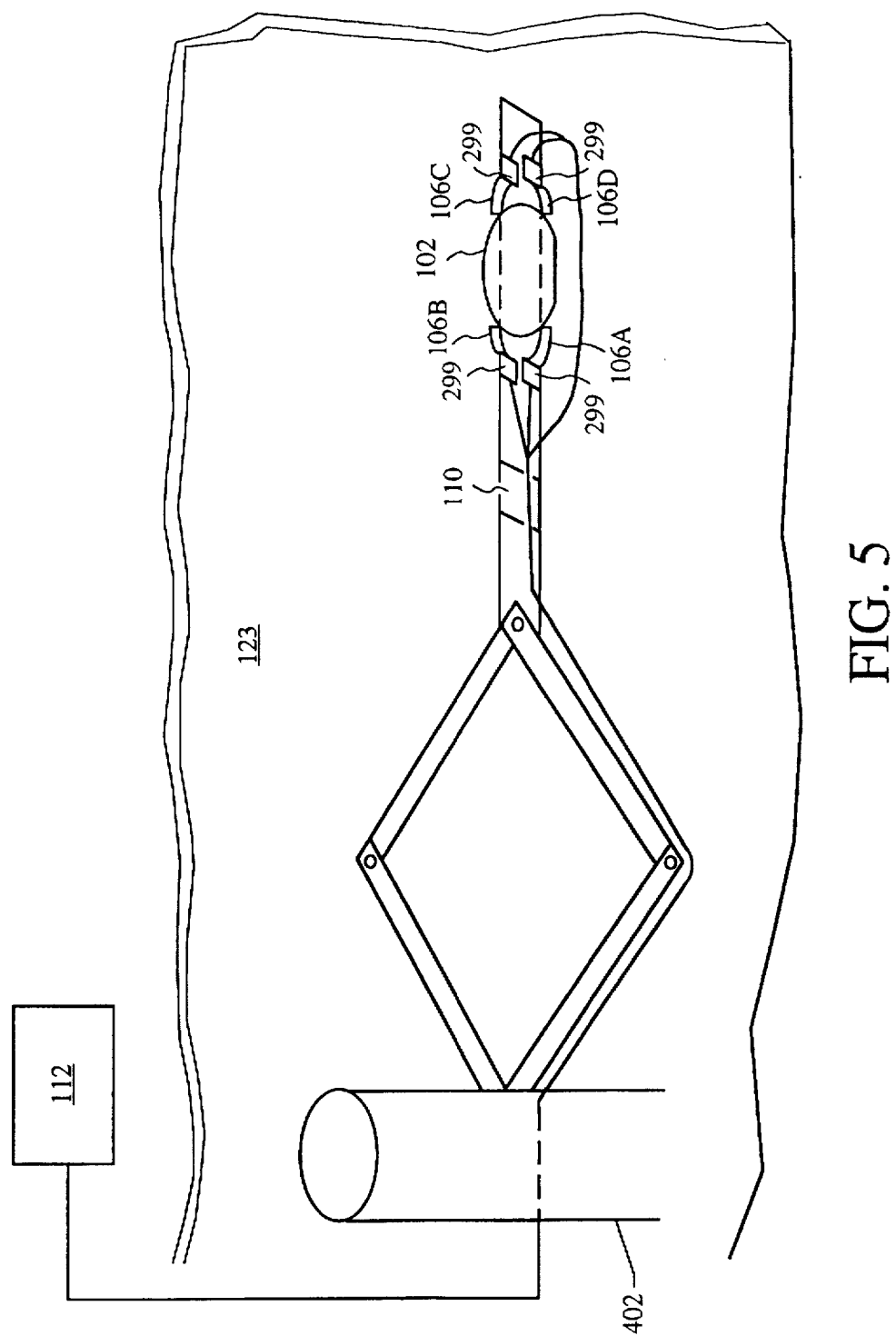
FIG. 5 is a partial perspective view of a wafer processing station including a wafer transport blade having a plurality of piezoelectric grippers according to the present invention.
Figures 5A, 6:
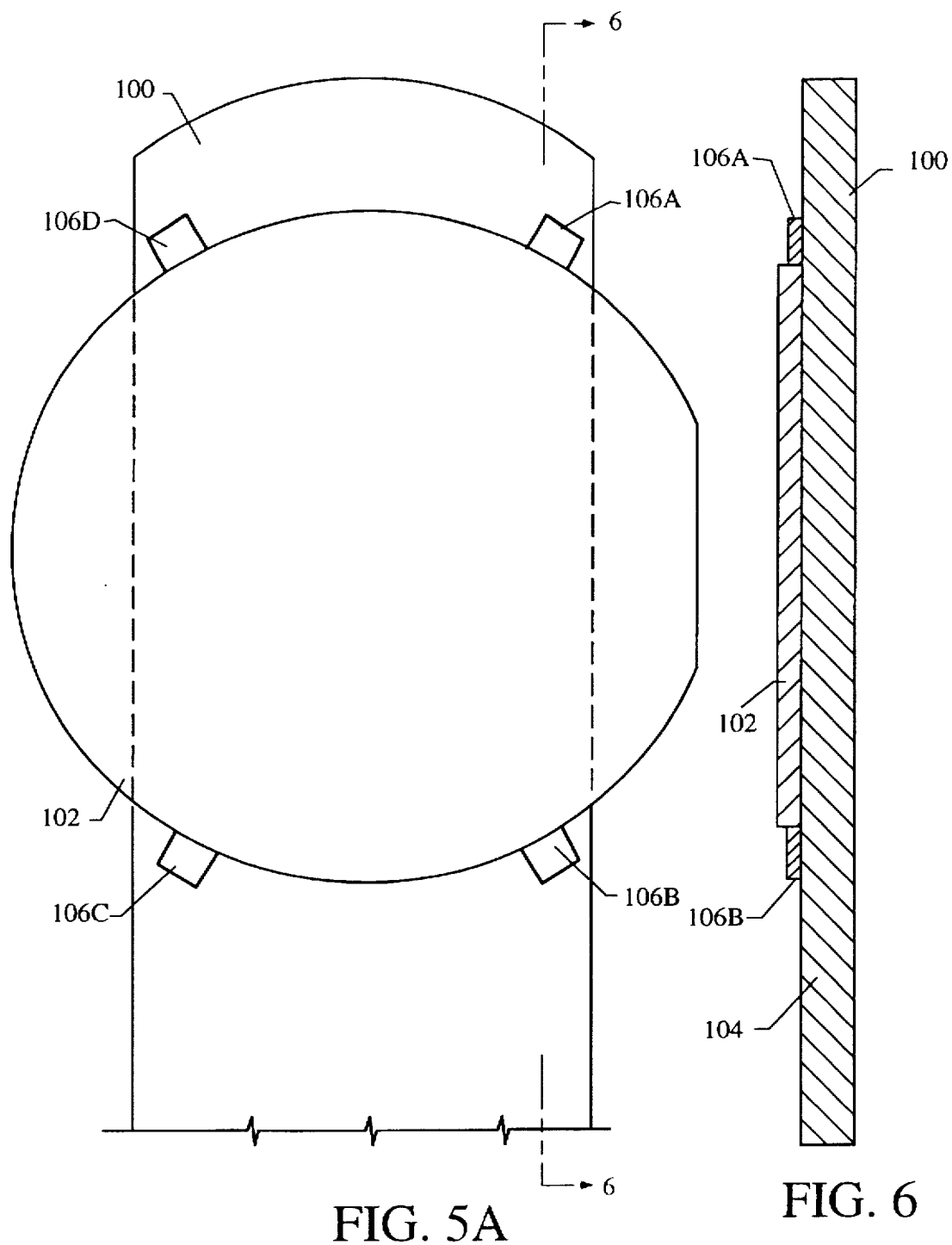
FIG. 5A is a partial top view of a blade including a plurality of piezoelectric grippers according to the present invention.
FIG. 6 is a cross-sectional side view through line 6—6 on FIG. 5A.

Referring now to FIGS. 5 through 8, there is shown a blade 100 on which a wafer 102 may be supported for transfer between any of various wafer fabrication chambers. Blade 100 may have a substantially flat, planar top surface 104 on which the wafer is supported, and although not critical to the present invention, the blade 100 may be approximately 60 mils thick. In accordance with the present invention, a plurality of piezoelectric grippers 106a–d (shown schematically in FIGS. 5, 5A and 6) may be mounted to extend above surface 104 of blade 100. Although four piezoelectric grippers are shown in FIG. 5, it is understood that as few as two or more than four piezoelectric grippers may be employed to grip wafer 102 in alternative embodiments of the present invention. The piezoelectric grippers 106a–d are preferably provided at the edges of blade 100 so that, when a wafer 102 is located on the blade 100, the grippers 106a–d lie symmetrically spaced apart with respect to each other around the outer circumference of the wafer 102. It is contemplated that the piezoelectric grippers be located to engage wafer 102 at positions other than that shown in FIGS. 5 and 5A, and it is further contemplated that piezoelectric grippers according to the present invention may be mounted on attachments to blade 100 so as to engage wafer 102 at locations of the wafer lying outside of the footprint of blade 100.

Except for the position on blade 100 and the orientation with respect to wafer 102, each of the piezoelectric grippers 106a–d are structurally and operationally identical to one another. As such, only one piezoelectric gripper, 106a, is described hereinafter. It is understood however that the following description applies to each of the other piezoelectric grippers as well.

Figure 7:
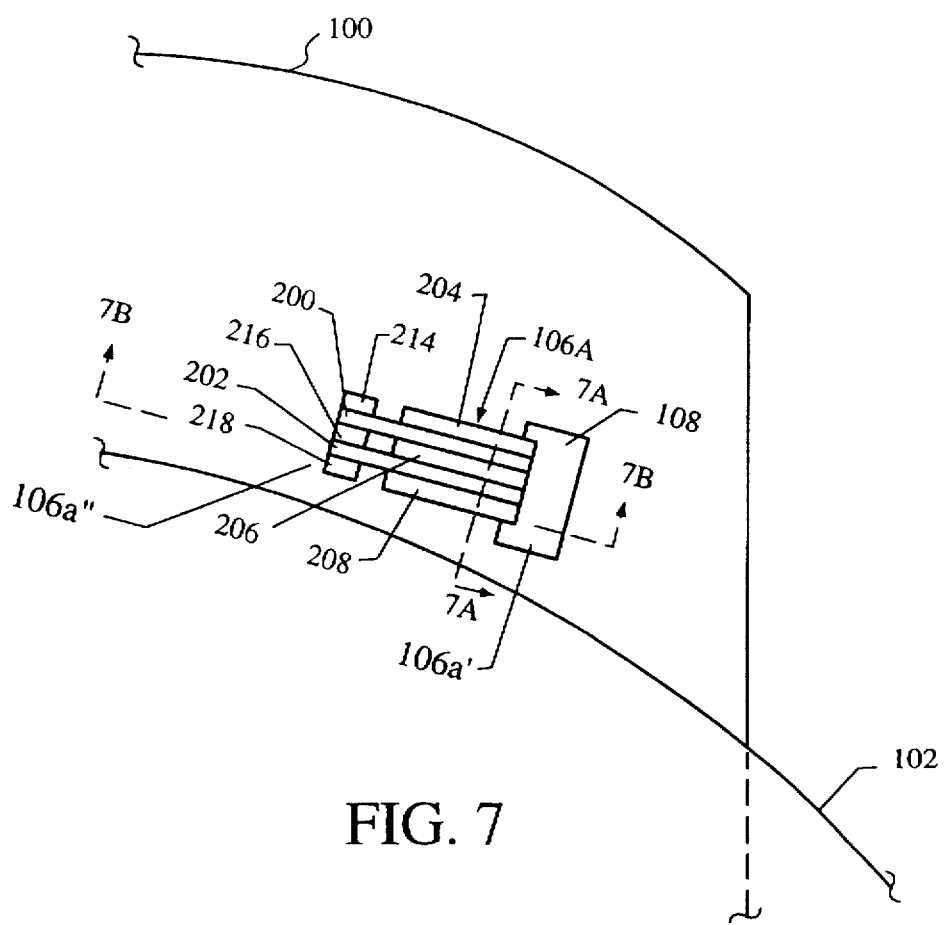
FIG. 7 is an enlarged partial top view of a piezoelectric gripper according to the present invention in a first state where it is not gripping a wafer.
Figure 8:
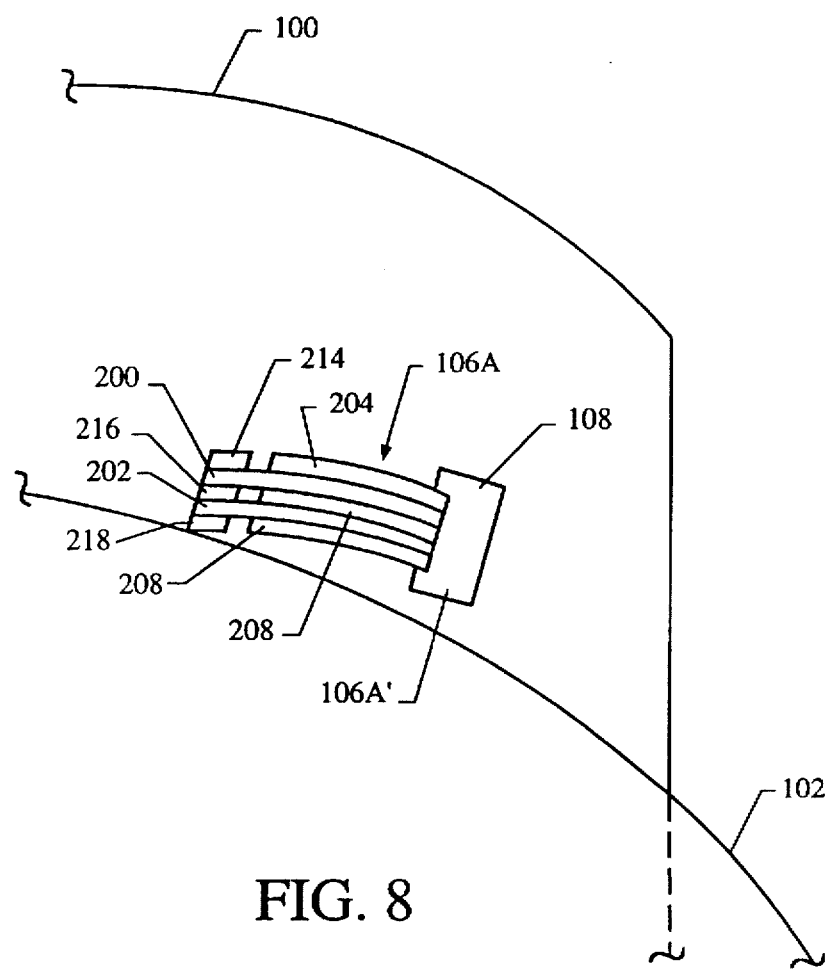
FIG. 8 is an enlarged partial top view of a piezoelectric gripper according to the present invention in a second state where it is in contact with a wafer.
Figure 9:
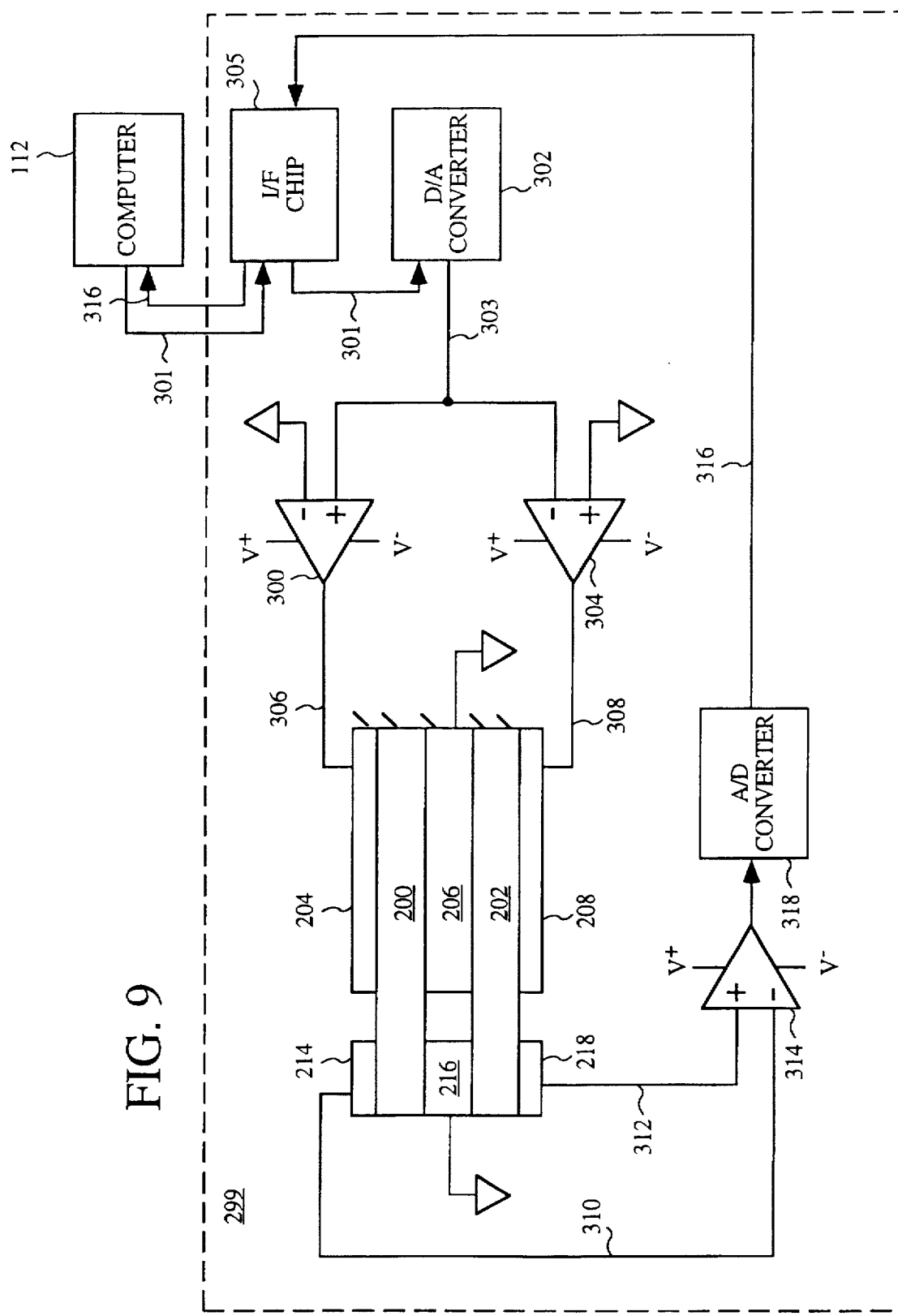
FIG. 9 is a schematic representation of a piezoelectric gripper and electrical circuit for controlling the gripper according to the present invention.

As best seen in FIGS. 7 through 9, in a preferred embodiment of the invention, piezoelectric gripper 106a comprises a bimorph having a pair of piezoelectric layers 200 and 202 interleaved between three electrode layers 204, 206, and 208. Piezoelectric layers 200, 202 are preferably formed of a polycrystalline ceramic material including, for example, lead-zirconate-titanate or lead-magnesium-niobate compounds. The layers 200, 202 may instead comprise a pure piezoelectric crystal, such as for example quartz, in an alternative embodiment of the invention. Layers 200, 202 each preferably have a thickness of approximately 0.006 inches, a width of approximately 0.1 inches, and a length of approximately 1.0 inches.

Electrode layers 204, 206 and 208 are formed of an electrical conductor, such as for example, any of various metals including nickel and copper. The inner electrode layer 206 preferably has a thickness of approximately 0.06 inches, a width of approximately 0.1 inches, and a length of approximately 0.6 inches. The piezoelectric layers 200, 202 are preferably glued or otherwise bonded to the inner electrode layer 206 by an epoxy. The outer electrode layers 204 and 208 preferably have the same length and width as layer 206, and are made of a thin metallic coating, formed on the piezoelectric layers 200, 202 for example by electroless nickel coating, or other similar process. It is understood that the above described dimensions for layers 200–208 may vary in alternative embodiments of the invention (the dimensions of layers 200–208 are not drawn to scale in the figures).

It is further contemplated that embodiments of the present invention include a piezoelectric gripper having greater than five layers. For example, the gripper may have three piezoelectric layers interspersed between four electrode layers; or four piezoelectric layers interspersed between five electrode layers. As is known in the art, multimorph structures such as these may be formed with thin metallic layers that are co-fired with the piezoelectric ceramic. Bimorph and multimorph structures of the type contemplated for use in the present invention may be obtained from Litton Itek Optical Systems, Lexington, Mass.

Figure 7A:
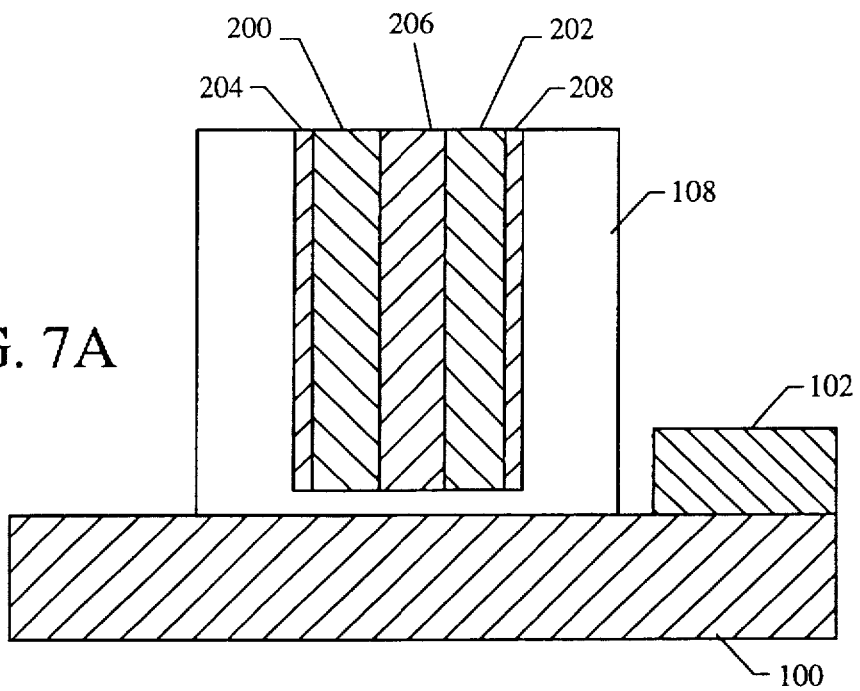
FIG. 7A is a cross sectional view of a piezoelectric gripper through line 7A—7A in FIG. 7.
Figure 7B:
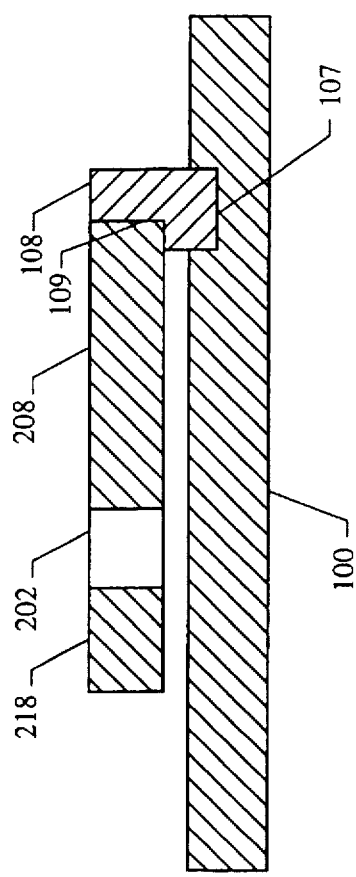
FIG. 7B is a cross sectional view of a piezoelectric gripper through line 7B—7B in FIG. 7.

As shown in FIGS. 7, 7A, 7B and 8, piezoelectric gripper 106a includes a first end 106a' mounted to a support block 108, and a second, free end 106a" opposite end 106a' for engaging the wafer 102. The support block 108 is preferably formed of an electrically insulative, machinable material having low outgassing properties. Such materials include, for example, quartz and various ceramics. As would be appreciated by those skilled in the art, support block 108 may be formed of other materials. As best seen in FIG. 7B, the blade 100 may be machined with a plurality of detents 107 for receiving each of the support blocks 108. The machining process may be controlled to precisely locate the detents on the blade so that the support blocks position end 106a", as well as the corresponding ends of each of the other grippers, approximately ½ millimeter away from the outer diameter of the wafer. It is understood that this distance may vary in alternative embodiments of the invention. The support block 108 may be secured within the detent 107 by a conventional adhesive or epoxy having low outgassing properties.

The support block 108 may be formed with an indent 109 for receiving the piezoelectric gripper 106a. The gripper 106a may be affixed within the indent 109 by various methods, including by a conventional adhesive or epoxy having low out-gassing properties. As seen in FIGS. 7A and 7B, a lower surface of piezoelectric gripper 106a adjacent the surface of blade 100 is slightly spaced from the surface of blade 100, so that the gripper 106a may move without frictional contact with blade 100. Having end 106a' mounted to the support block 108, the end 106a" of piezoelectric gripper 106a can bend in a plane substantially parallel to the plane of blade 100. The gripper 106a is shown in FIG. 7 in a relaxed state, i.e., no voltage is supplied to the gripper. The gripper 106a is shown in FIG. 8 in its actuated state, i.e., voltage is supplied to the gripper.

Figure 7C:
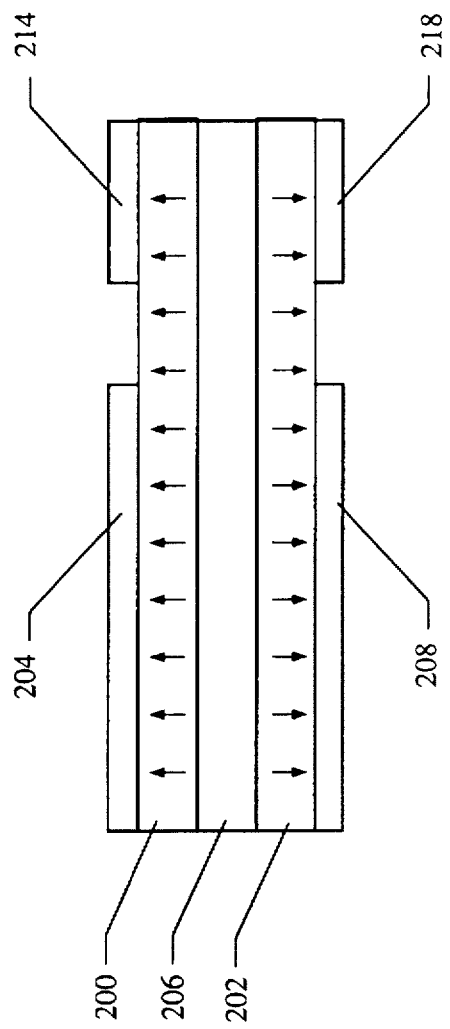
FIG. 7C is an enlarged cross sectional view of a piezoelectric gripper showing polarization vectors.

In one embodiment of the invention, the piezoelectric layers 200, 202 may have polarization vectors as shown by the arrows in layers 200, 202 in FIG. 7C. Upon application of a voltage, as will be explained in greater detail below, with such a polarization, layer 200 elongates and layer 202 shortens. The elongation and shortening of layers 200 and 202, respectively, causes the gripper 106a to bend toward the wafer 102.

Voltage is supplied to the piezoelectric gripper 106a via the electrical circuit 299 shown in FIG. 9, which circuit is preferably mounted on the blade 100 adjacent to each of the piezoelectric grippers 106a–d. The electrical circuit 299 includes an interface (I/F) chip 305 for transferring signals to and from a computer 112. In an alternative embodiment of the invention, the chip 305 may itself be a single chip microprocessor for performing the functions of the computer 112 with regard to controlling operation of the gripper 106a as described hereinafter. In this alternative embodiment, the circuit 299 may operate independently of the computer 112.

Where the component 305 is an I/F chip, the computer 112 outputs a successively incrementing digital voltage control signal 301, which signal is communicated by the I/F chip 305 and converted into an analog control signal 303 by a conventional digital-to-analog (D/A) converter 302. A first operational amplifier (op-amp) 300 has an inverted input connected to ground, and a non-inverted input receiving the analog voltage control signal 303. A second op-amp 304 has a non-inverted input connected to ground, and an inverted input receiving the same analog voltage control signal 303. The first op-amp 300 outputs a positive voltage signal 306, and the second op-amp 304 outputs a negative voltage signal 308 of the same magnitude as voltage signal 306 but inverted with respect to ground.

Voltage signals 306 and 308 are received in outer electrode layers 204 and 208, respectively. Inner electrode layer 206 is connected to ground. Thus, adapting the convention where an electric field flows from positive to negative, an electric field is established flowing across piezoelectric layer 200 from layer 204 to grounded layer 206. A similarly directed electric field is established flowing across piezoelectric layer 202 from grounded layer 206 to layer 208. With the polarization vectors in piezoelectric layer 200 oriented as shown on FIG. 7C, the electric field is flowing generally against the direction of the polarization vectors in piezoelectric layer 200, thus causing layer 200 to elongate. Conversely, with the polarization vectors in piezoelectric layer 202 oriented as shown on FIG. 7C, the electric field is flowing generally with the direction of the polarization vectors in piezoelectric layer 202, thus causing layer 202 to shorten. The elongation of layer 200 and the shortening of layer 202 will cause the piezoelectric gripper 106a to bend in a downward direction with respect to the view of the gripper 106a shown in FIG. 9.

In a preferred embodiment, the voltage signal 306 and negative voltage signal 308 may be carried to the layers 204 and 208, respectively, by electrical leads that are spot welded to the exposed surfaces of layers 204 and 208 adjacent the support block 108. As would be appreciated by those skilled in the art, the leads may be affixed to the layers 204 and 208 by means other than spot welding, and the signals 306 and 308 may be communicated to the electrode layers 204 and 208 by means other than electrical leads.

As indicated, the digital voltage control signal 301 is incremented by the computer so that the voltage signals 306 and 308 supplied to the layers 204, 208, respectively, increment as well. In one embodiment of the present invention, the voltage control signal may increment once every 1 to 10 milliseconds. This time interval may however be less than 1 and greater than 10 milliseconds in alternative embodiments. The gripper 106a will bend to a greater degree upon each increment of the voltage control signal 301 from the computer 112, until the signal 301 stops incrementing as explained hereinafter.

Figure 9A:
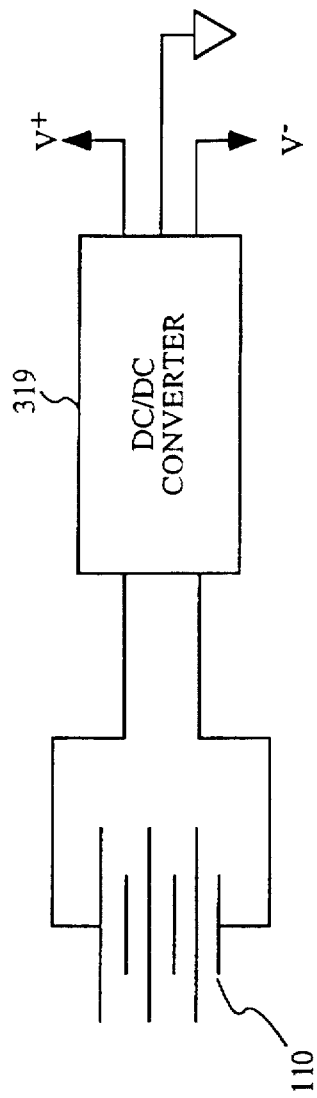
FIG. 9A is a voltage source for supplying a voltage to the gripper shown in FIG. 9.

The first and second op-amps 300 and 304 are powered by a voltage source 110 (FIGS. 5 and 9A) preferably outputting ±1.5 to ±9 volts. It is understood that the voltage output from voltage source 110 may be less than 1.5 or greater than 9 volts in alternative embodiments of the invention. In a preferred embodiment, the voltage output from the voltage source 110 is converted via a DC/DC converter to produce +100 V and −100 V outputs. Thus, in a preferred embodiment, voltage signal 306 ranges between 0 and +100 V, and the negative voltage signal 308 ranges between 0 and −100 V.

It is understood that the electrical circuit shown in FIG. 9 and described above is but one of many electrical circuits that may be employed in alternative embodiments of the invention to achieve the desired controlled bending of piezoelectric gripper 106. As would be appreciated by those skilled in the art, the voltage supplied to the electrode layers 204, 206 and 208 may be varied, and the orientation of the polarization vectors within the piezoelectric layers 200 and 202 may be varied, provided that the result of the electrical circuit is that the electric field established across the piezoelectric layers causes one of the piezoelectric layers to incrementally elongate to a greater degree than the other piezoelectric layer. Moreover, as would be appreciated by those skilled in the art, a completely analog system may be employed for controlling the bending of the grippers 106a–d in an alternative embodiment of the present invention.

In operation, when a wafer 102 is initially seated on a blade 100, each of the piezoelectric grippers 106a–d may be spaced away from a circumferential edge of the wafer as shown in FIG. 7. It is unlikely that the wafer 102 will be centered with respect to each of the piezoelectric grippers 106a–d. Referring again to a single gripper, 106a, as indicated by the flow chart shown in FIG. 13, the voltage control signal associated with gripper 106a will increase in step 1302 until gripper 106a contacts the outer circumference of the wafer (FIG. 8) and exerts a measurable force on the wafer in step 1303. At this point, the wafer 102 will similarly exert a measurable counter force on the gripper 106a.

As shown in FIGS. 7, 8 and 9, the gripper 106a further includes three sensor layers 214, 216, and 218, which layers are attached to, and separated by, the piezoelectric layers 200, 202. The sensor layers 214, 216, 218 are electrically conductive, and preferably formed initially as part of electrode layers 204, 206, 208. Thereafter, a portion of the layers are etched away by known etching processes to electrically isolate the sensor layers 214, 216, 218 from the electrode layers 204, 206, 208 respectively. In an alternative embodiment, as for example shown in FIG. 7C, only the outer sensor layers 214 and 218 are separated from the layers 204 and 208. The center layer 206 in this embodiment functions as both electrode layer 206 and as sensor layer 216 of the previously described embodiment. In both of the above-described embodiments, layer 206 is preferably connected to ground. In the embodiment where layer 206 undergoes an etching process to define an electrode layer 206 and a sensor layer 216, both layers 206 and 216 are preferably connected to ground.

The force exerted on the gripper 106a by the wafer, as a result of contact between the gripper and the wafer, will slightly bend the free ends of the piezoelectric layers 200, 202, i.e., the end of layer 202 will slightly elongate and the end of layer 200 will slightly shorten. With the layers 200, 202 having polarization vectors as shown in FIG. 7C, shortening of the layer 200 will generate an electric field between sensor layers 214 and 216. With layer 216 grounded, shortening of layer 200 will generate a positive voltage within sensor layer 214. The elongation of layer 202 will generate an electric field between sensor layers 216 and 218 creating a similar positive voltage within sensor layer 218. The voltages from layers 214 and 218 are sent as feedback voltage signals 310 and 312, respectively, to a third op-amp 314. The third op-amp 314 is powered by the voltage source 110. In a preferred embodiment, the feedback voltage signals 310 and 312 may be carried from the sensor layers 214 and 218 by flexible leads that are spot welded to the exposed surfaces of layers 214 and 218. As would be appreciated by those skilled in the art, the flexible leads may be affixed to the layers 214 and 218 by means other than spot welding, and the signals 310 and 312 may be communicated from the layers 214 and 218 by means other than electrical leads.

As shown in FIG. 9, the feedback voltage signal 310 is received as an inverted input to the third op-amp 314 and feedback voltage signal 312 is received as a non-inverted input to the third op-amp 314. The inverted and non-inverted inputs may however be switched in an alternative embodiment of the invention. The output from the third op-amp 314 is converted to a digital output signal 316 via an analog-to-digital (A/D) converter 318, and the digital output signal 316 is forwarded to the computer 112 via the I/F communications chip 305.

Figure 13:
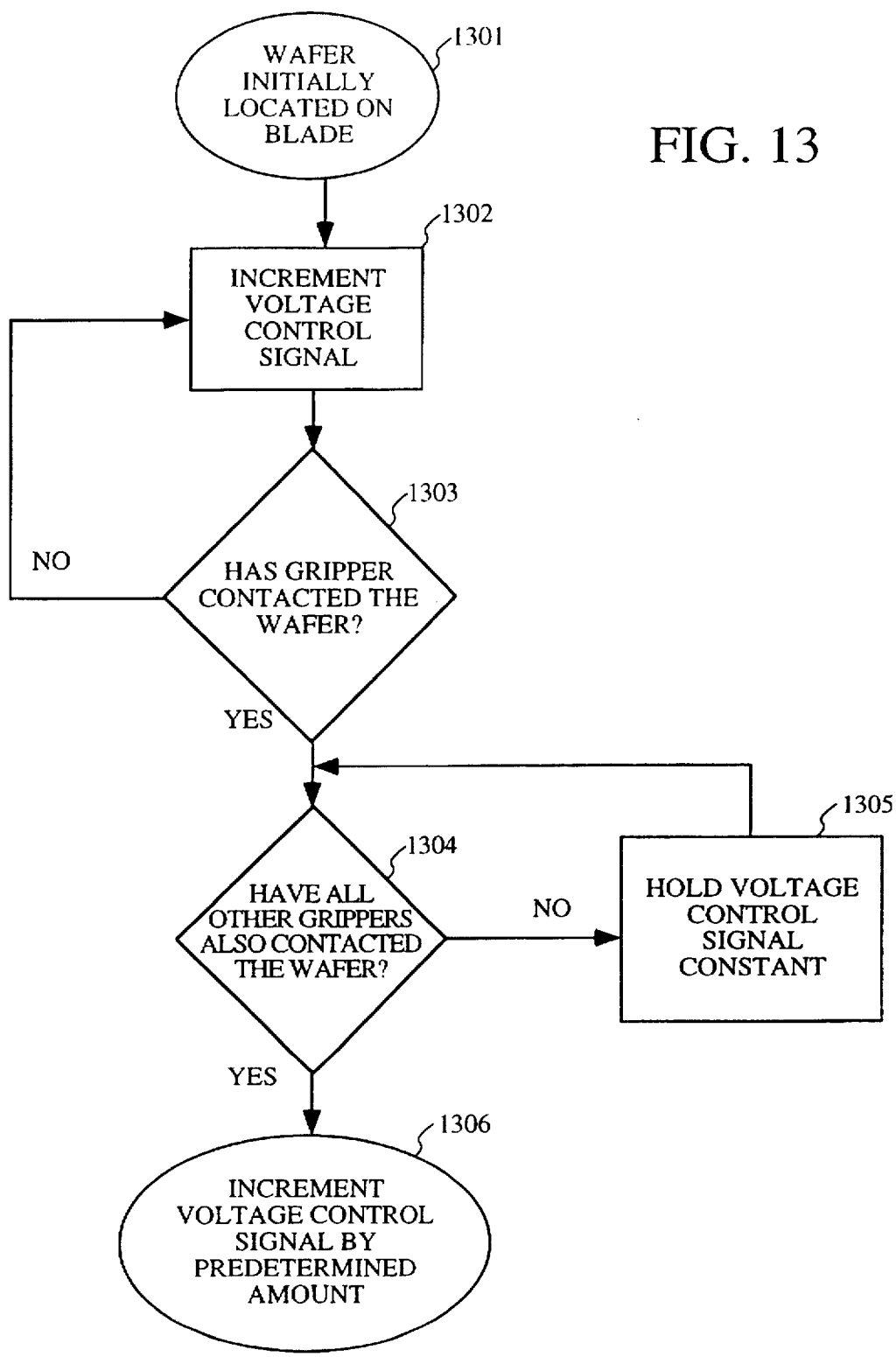
FIG. 13 is a flow chart showing the operation of a piezoelectric gripper to grip a wafer according to the present invention.

As indicated in the flow chart shown in FIG. 13, upon receipt of the digital output signal 316, the computer 112 stops incrementing the voltage control signal 301 at step 1305, and instead transmits a constant value for the voltage control signal 301. In this way, piezoelectric gripper 106a will bend toward the wafer 102 until it measurably engages the wafer 102, at which point the digital output signal will be generated to signal the computer to stop further bending of the piezoelectric gripper 106a. As described above with respect to the electronics for bending the gripper 106a, the system shown in FIG. 9 for sensing contact of the gripper with the wafer is but one of many electrical circuits that may be employed in alternative embodiments of the invention to sense contact of the gripper with the wafer. It is further understood that conventional sensing systems other than the piezoelectric system described above may be used to sense contact of the gripper with the wafer in alternative embodiments of the present invention. For example, in one embodiment of the invention, a strain gauge affixed to the gripper 106a may be used to sense contact between the gripper and the wafer.

Figure 12:
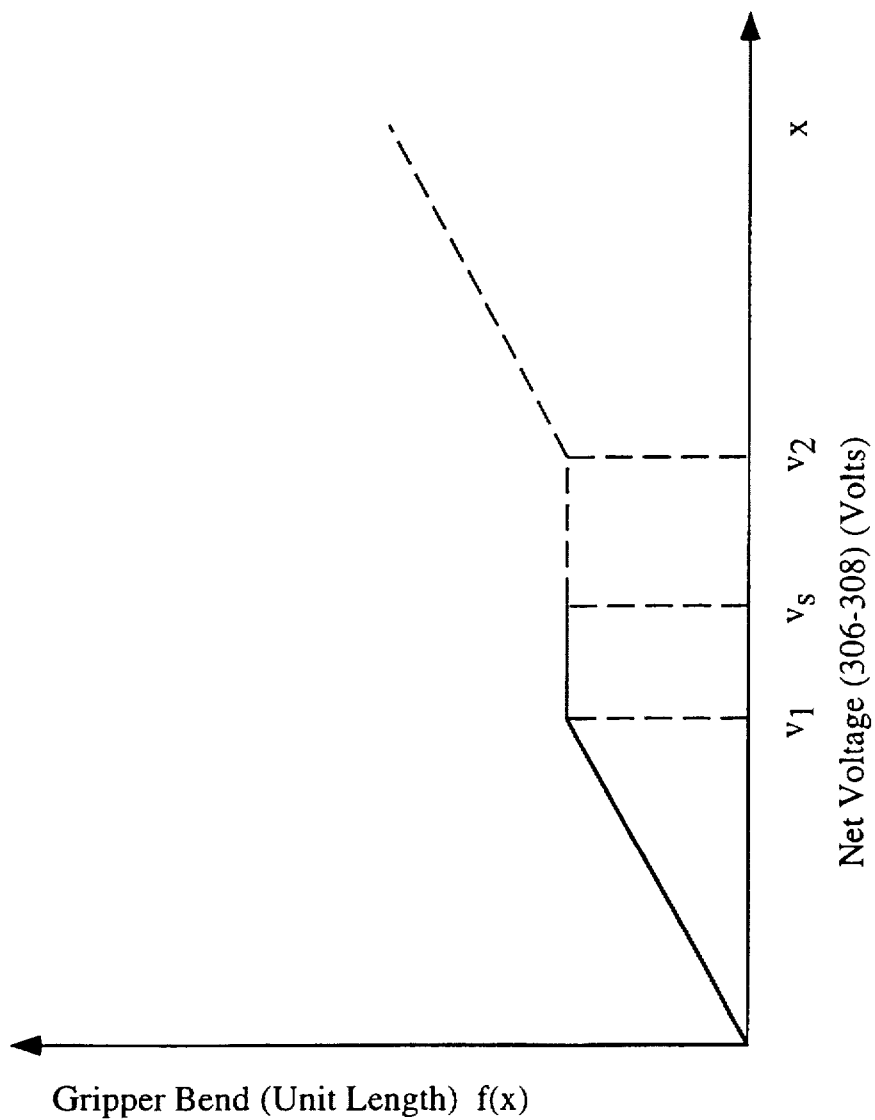
FIG. 12 is a graph of the voltage control signal versus the degree of bending of the piezoelectric gripper.

As a result of the extreme sensitivity of piezoelectric materials used in the gripper 106a, a very slight contact force between the gripper 106a and the wafer 102 will generate the digital output signal 316 that causes the computer to stop further bending of the gripper 106a. However, as shown by the graph of FIG. 12, it is not necessary that the voltage signal 306 or negative voltage signal 308 supplied to the electrode layers 204, 208, respectively, of the gripper 106a stop incrementing immediately upon contact of the gripper 106a with the wafer. In FIG. 12, the difference between the voltage signal 306 and the negative voltage signal 308 is shown along the x axis as the net voltage supplied to the gripper 106a. The degree of the bend, in unit length, of the gripper 106a is shown as a function, f(x), of the net voltage supplied to the gripper along the y axis. At some net voltage, $v_1$, the gripper 106a contacts the wafer 102. Immediately thereafter, although the net voltage continues to increment, the gripper 106a does not bend further because the static frictional force of the wafer on the blade opposes further bending of the gripper 106a. At some net voltage, $v_2$, the stresses within the gripper 106a could be sufficiently high to overcome the static frictional force of the wafer on the blade. If this net voltage $v_2$ was reached, the gripper would resume bending and the wafer would move with respect to the blade.

However, according to a preferred embodiment of the present invention, the sensor layers 214–218 generate feedback voltage signals 310, 312 that cause the gripper to stop further bending at some net voltage $v_s$. The net voltage $v_s$ occurs at a point somewhere between $v_1$ (initial contact of the gripper with the wafer) and $v_2$ (movement of the wafer on the blade). After the net voltage reaches the value $v_s$, further increment of the voltage signals 306, 308 is stopped, and further bending of the gripper 106a ceases (the dashed lines on the graph indicate what would happen if the net voltage were allowed to increase beyond the value of $v_s$). Although the relationship between the net voltage and the bending of the gripper 106a is shown to be generally linear in FIG. 12, it is understood that they may be non-linearly related in embodiments of the invention. Moreover, although the value of $v_s$ is shown at a particular location between $v_1$ and $v_2$, it is understood that the value $v_s$ may be located at any point between $v_1$ and $v_2$ in alternative embodiments of the invention.

Each of the piezoelectric grippers 106a–d will operate as described above with respect to piezoelectric gripper 106a until each of the piezoelectric grippers 106a–d are in contact with the outer circumference of wafer 102. As shown at steps 1304 and 1306 of the flow chart of FIG. 13, once all grippers are in contact with the wafer, the computer 112 will simultaneously increase the voltage control signal to each gripper 106a–d by a predetermined amount. In response, each gripper exerts a force on the wafer to secure the wafer on the blade. Thereafter, the blade 100 may transfer the semiconductor wafer 102 at extremely high speeds without the wafer 102 moving with respect to the blade 100.

Figure 1:
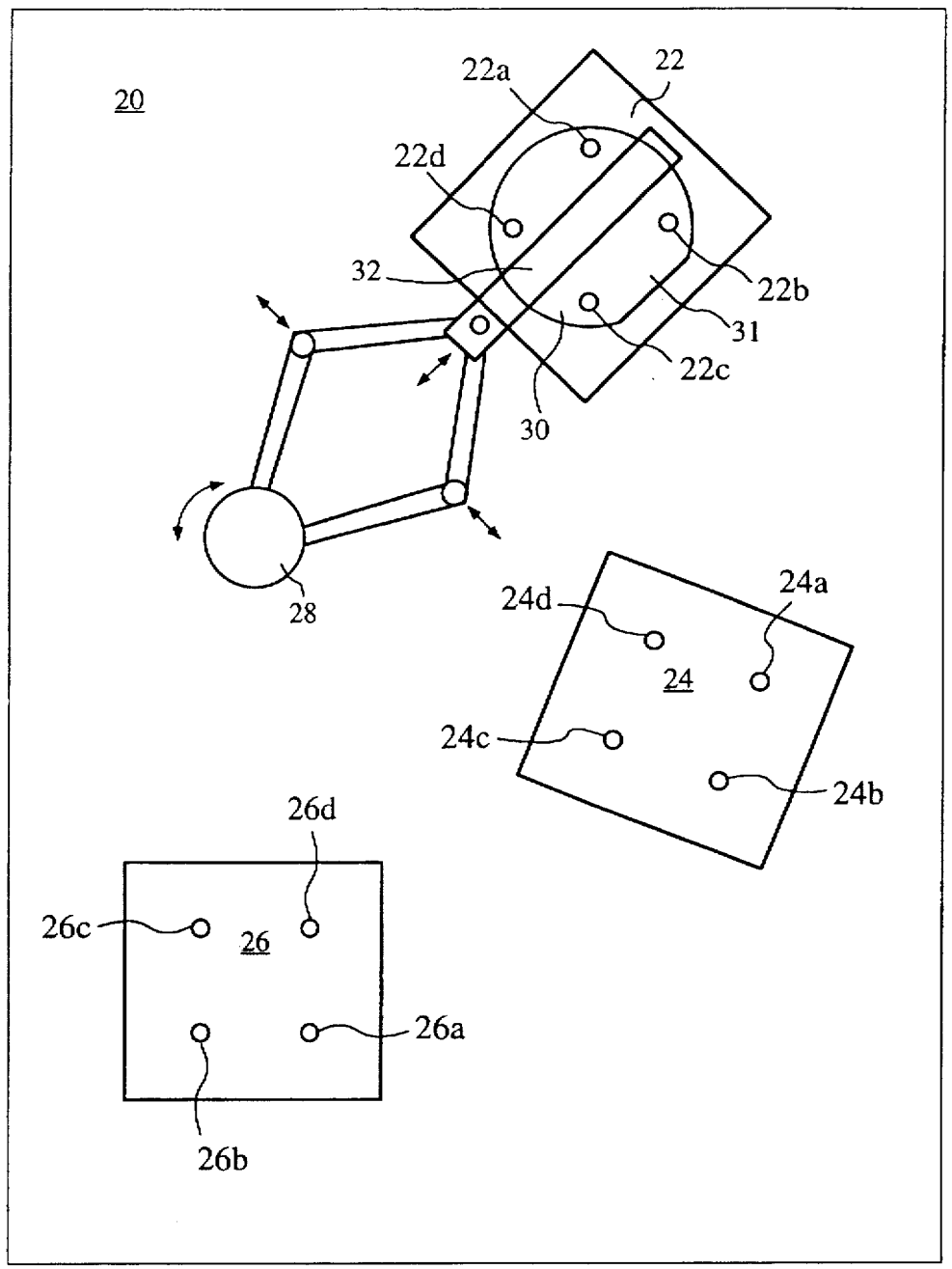
FIG. 1 is a top view of conventional processing equipment including a plurality of processing chamber.
Figures 2, 3:
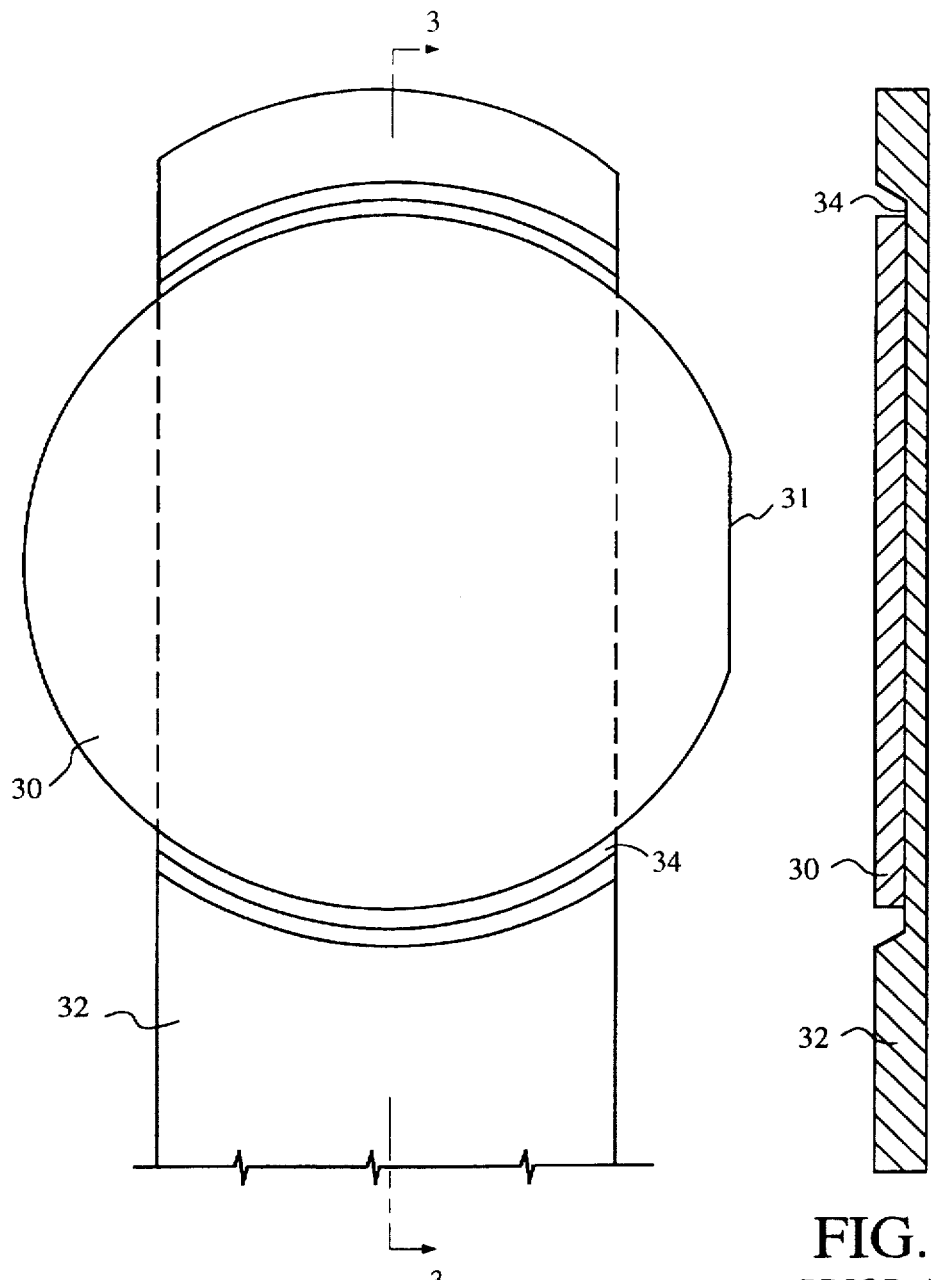
FIG. 2 is a partial top view of a conventional blade with a semiconductor wafer freely seated thereon.
FIG. 3 is a cross-sectional side view of the blade and semiconductor wafer through line 3—3 of FIG. 2.
Figure 3A:
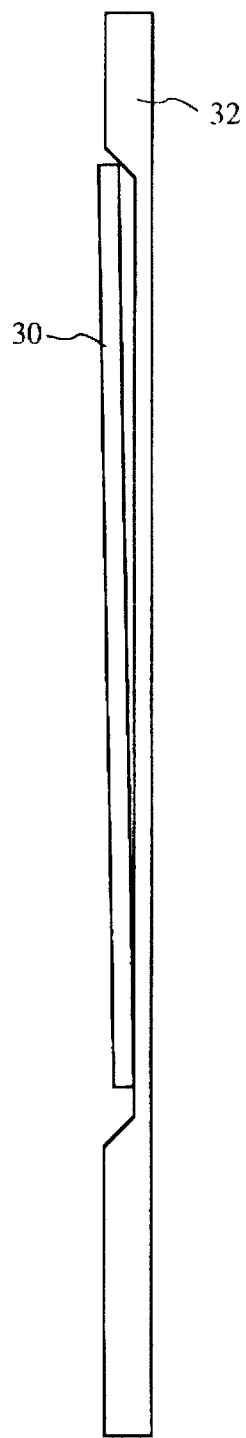
FIG. 3A is a side view of a conventional robot arm blade with a wafer improperly seated in the blade depression.
Figure 4:
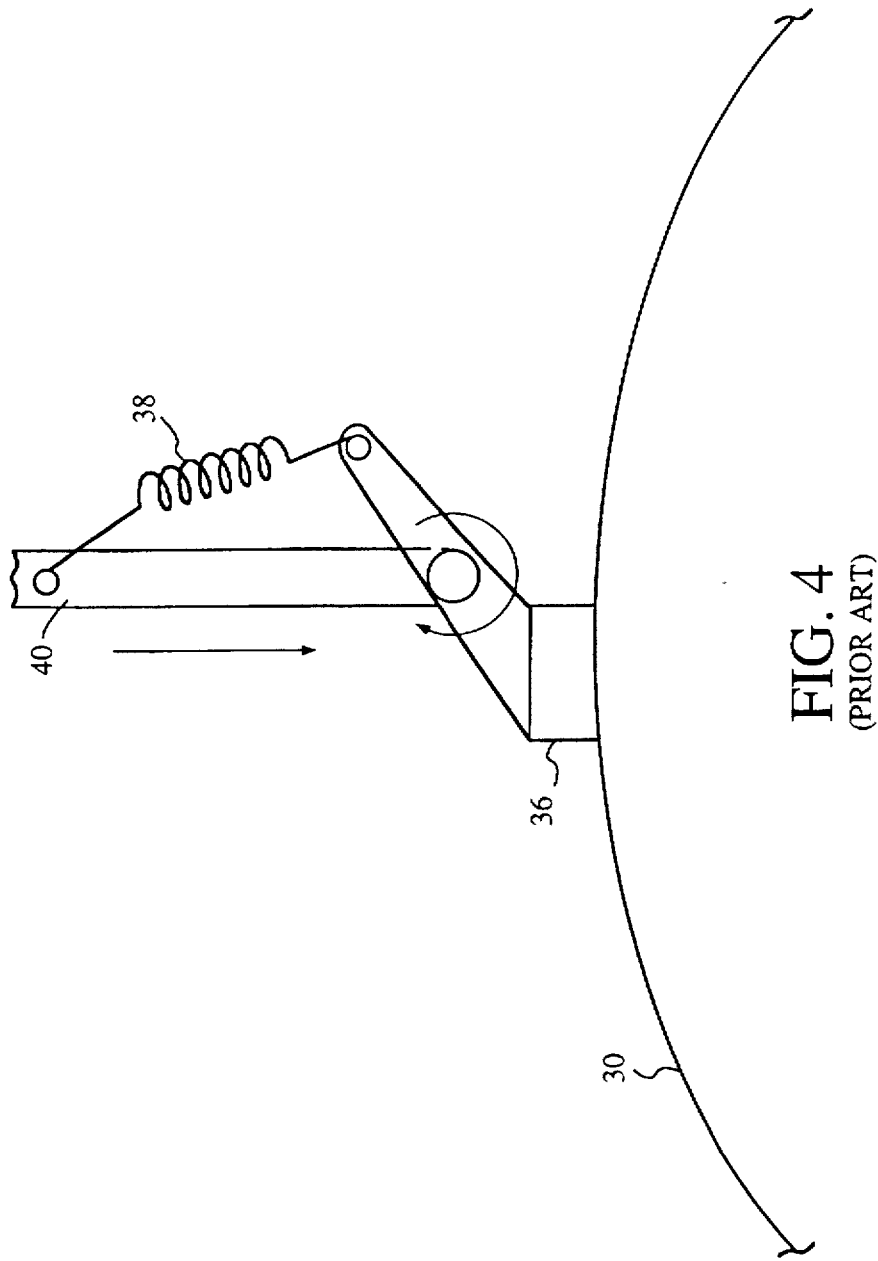
FIG. 4 is a partial top view of a conventional spring loaded chuck for engaging and securing a semiconductor wafer onto a blade.

Referring now to the flow chart shown in FIG. 14, once a wafer has been transferred to and is positioned within a next chamber of the wafer fabrication process, the blade 100 deposits the wafer 102 on the lift pins, for example lift pins 24a–d (FIG. 1) as follows. Once again, although the following description refers to a single gripper, for example 106c, the following description applies to each of the grippers. The computer 112 monitors the blade 100 in a step 1400 to see if the blade is properly positioned within the next chamber. Once a wafer is properly positioned, in a preferred embodiment, the voltage control signal 301 to gripper 106c is ramped down in a step 1402. As the voltage control signal 301 ramps down, the gripper 106c relaxes and the force exerted by the gripper on the wafer decreases. As discussed above, the digital output signal 316 for each gripper is a measure of the force of that gripper on the wafer. Thus, as the force exerted by the gripper 106c on the wafer decreases, the digital output signal 316 for gripper 106c similarly decreases.

In a step 1404, when the digital output signal for gripper 106c reaches a predetermined value indicative of a zero or near zero force of the gripper 106c on the wafer, the computer stops ramping down the voltage control signal to gripper 106c, thus stopping further release of the wafer by the gripper 106c. In a step 1406, the computer next determines whether the digital output signal for all of the other grippers (106a, 106b, and 106d in an embodiment having four grippers) have ramped down to the predetermined value. If all of the other grippers have not, then the voltage control signal for gripper 106c is held constant in a step 1405. If the digital output signals for all of the other grippers have reached the predetermined value in the step 1406, the voltage to all of the grippers is shut off in a step 1408, thus causing all of the grippers to return to a relaxed state clear of the wafer. Thereafter, the lift pins raise up to lift the wafer off of the blade, the blade withdraws from the chamber, and the lift pins lower the wafer onto a chuck for processing.

It is understood that the grippers in accordance with the present invention may be controlled by computer 112 to release the wafer differently from the sequence described above in alternative embodiments of the invention. For example, in an alternative embodiment described in association with the flow chart shown in FIG. 15, after the computer 112 determines that the blade is properly positioned within the next chamber in a step 1500, the voltage control signal for a gripper, for example gripper 106c, is ramped down in a step 1502 to thereby decrease the force exerted by gripper 106c on the wafer. As described above with respect to FIG. 14, as the voltage control signal for a gripper ramps down, the digital output signal for that gripper similarly decreases.

In a step 1504, the computer monitors the digital output signal for gripper 106c. It may happen that one or more of the grippers ramp down more quickly than the remaining grippers. Therefore, in a step 1506, if, for example, the digital output signal for the gripper 106c decreases faster than one or more of the other grippers, such that the next closest digital output signal for the one or more other grippers differs by more than a predetermined differential value, then the voltage control signal associated with gripper 106c would be held constant. While the voltage control signal for the gripper 106c is held constant, the voltage control signals for the one or more other grippers continue to ramp down (unless there is a similar difference within the digital output signals of the other grippers, in which case, one or more of them would be held constant as well).

The computer 112 continues to monitor the gripper 106c in step 1504, such that when the difference between the digital output signal for the gripper 106c (in this example) and the next closest digital output signal again drops below the above-mentioned predetermined differential value, the voltage control signal for the gripper 106c again continues to ramp down. In this way, each of the grippers are controlled to release their gripping force on the wafer in relative unison.

In a step 1508, when the digital output signal for gripper 106c reaches a predetermined value indicative of a zero or near zero force of the gripper 106c on the wafer, the computer stops ramping down the voltage control signal to gripper 106c, thus stopping further release of the wafer by the gripper 106c. In a step 1510, the computer next determines whether the digital output signals for all of the other grippers have ramped down to the predetermined value. If all of the other grippers have not, then the voltage control signal for gripper 106c is held constant in a step 1512. If the digital output signals for all of the other grippers have reached the predetermined value in the step 1510, the voltage to all of the grippers is shut off in a step 1514, thus causing all of the grippers to return to a relaxed state clear of the wafer. Thereafter, the lift pins raise up to lift the wafer off of the blade, the blade withdraws from the chamber, and the lift pins lower the wafer onto a chuck for processing.

Figure 15:
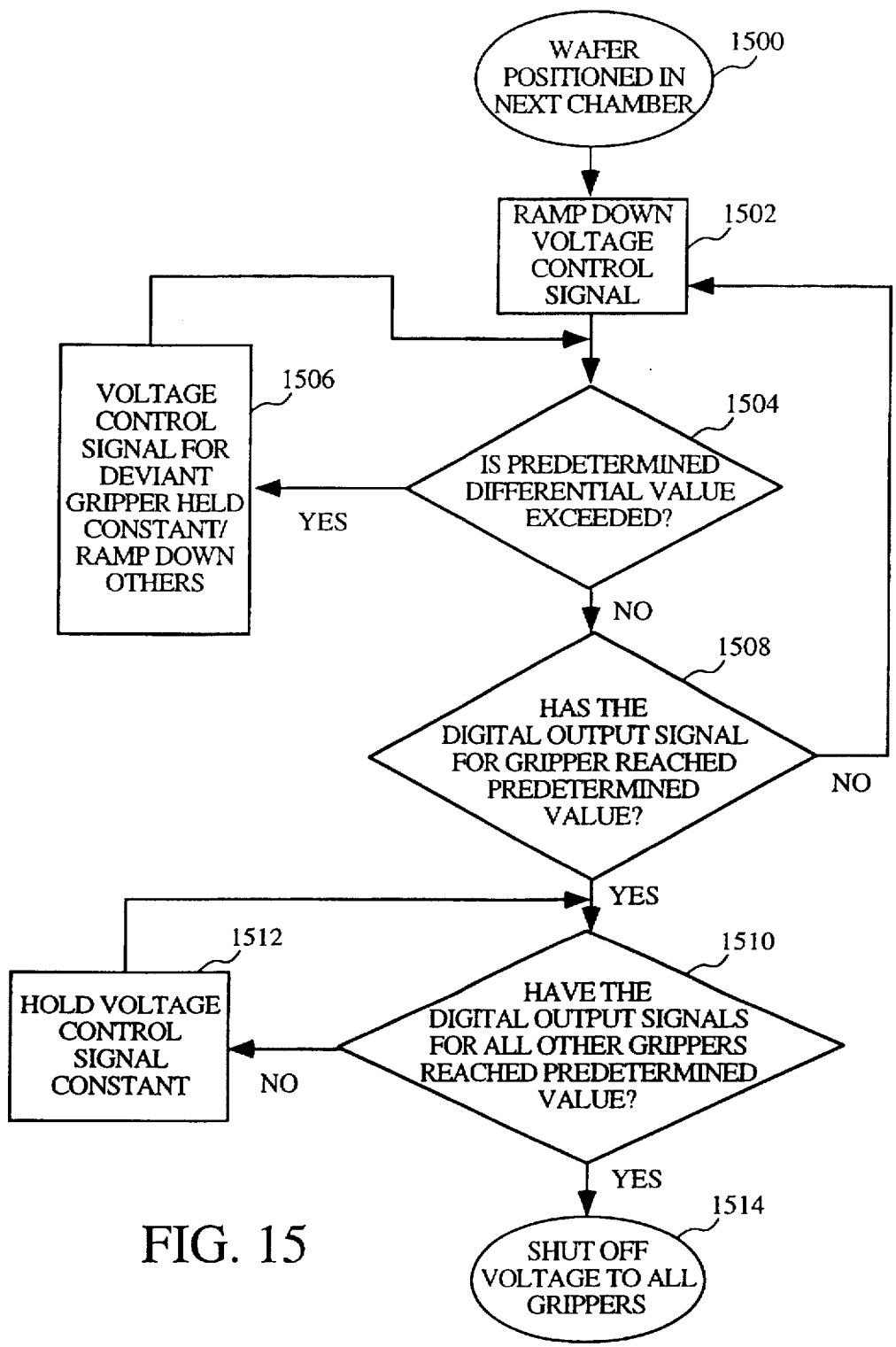
FIG. 15 is a flow chart showing the operation of a piezoelectric gripper to un-grip a wafer according to an alternative embodiment of the present invention.

The embodiment described with respect to FIG. 15 in effect slows down grippers that are releasing the wafer faster than the other grippers. An alternative embodiment to that described with respect to FIG. 15 may operate similarly to FIG. 15, with the exception that the grippers that release the wafer more slowly may be sped up. As would be appreciated by those skilled in the art, this may be accomplished by monitoring the digital output signals of the grippers, and decreasing the voltage control signal(s) for the slower gripper(s) at a greater rate than the voltage control signal(s) for the other gripper(s).

In general, the position of a semiconductor wafer 102 on the blade 100 may vary approximately ½ millimeter with respect to successive wafer transfers. Therefore, in a preferred embodiment of the present invention, the end of each piezoelectric gripper 106a–d adjacent to the wafer 102 is capable of bending approximately ½ millimeter. For piezoelectric grippers of the approximate dimensions stated above, a ½ millimeter bend may be accomplished by a voltage change of approximately 0 to approximately ±100 volts.

In a preferred embodiment, the voltage source 110 may be a dedicated power supply, such as a rechargeable battery, that is supported on the blade 100 as shown on FIG. 5. However, the voltage source may alternatively be formed of other voltage supply mechanisms, such as for example, charged capacitors or solar energy devices. Moreover, it is understood that the voltage source may be located within the processing chamber at locations other than on the blade, such as for example somewhere on the robotic transfer mechanism 402. The voltage source may be encapsulated in a plastic housing as is known in the art to protect the voltage source from the elements within the chamber environment, and to prevent any outgassing from the voltage source from entering the chamber environment. Where the voltage source is located on the blade 100, flexible or non-flexible electrical leads may be used to connect the voltage source to each of the electrical circuits 299 associated with each of the respective grippers. Where the voltage source is located elsewhere within the processing chamber, for example on the robotic transfer mechanism, flexible electrical leads may be used to connect the voltage source to each of the electrical circuits 299. It is further understood that the voltage source 110 may alternatively be located outside of the process station. Here again, flexible electrical leads may be used to electrically connect the voltage source to the respective electrical circuits. It is also contemplated that more than one voltage supply 110 may be used to supply voltage to the grippers 106a–d in alternative embodiments of the invention.

The electrical circuit 299 shown in FIGS. 5 and 9 may be mounted on the blade adjacent each of the grippers. With the exception of a portion of the electrical leads connected to the electrode layers 204, 208 and sensor layers 214, 218, the components of the electrical circuit 299 may be encapsulated in a plastic housing as is known in the art to protect the circuit from the elements within the chamber environment. Electrical leads may carry the voltage control signal from the computer 112 to the I/F communications chip 305, and also carry the digital output signal from the communications chip 305 to the computer 112.

The environment within the wafer fabrication processing station may be harmful to electrical leads and/or the lead insulation. Therefore, in an alternative embodiment of the present invention shown in FIG. 10, the leads within the chamber carrying the voltage control signals and the digital output signals to and from the electrical circuits 299 of each gripper may be omitted, and signals may be transferred between the computer 112 and the I/F chip 305 of the circuits 299 via optical means such as a first infrared signal transmitter/receiver 118 electrically coupled to the communications chip of each circuit 299, and a second infrared signal transmitter/receiver 120 electrically coupled to the computer 112 The transmitter/receiver 120 may be mounted adjacent a transparent window 121 provided as part of the process station housing 123. As is known in the art, the first and second infrared transmitters/receivers 118, 120 allow the computer 112 to send and receive the voltage control signals and digital output signals, respectively, via infrared signals. As is further known in the art, the infrared signals may be coded to prevent cross talk between the various grippers 106a–d. In the embodiment where the component 305 is a single chip microprocessor, the electrical leads or infrared transmitters for transferring signals between the computer and the electrical circuit may be omitted.

Figure 10:
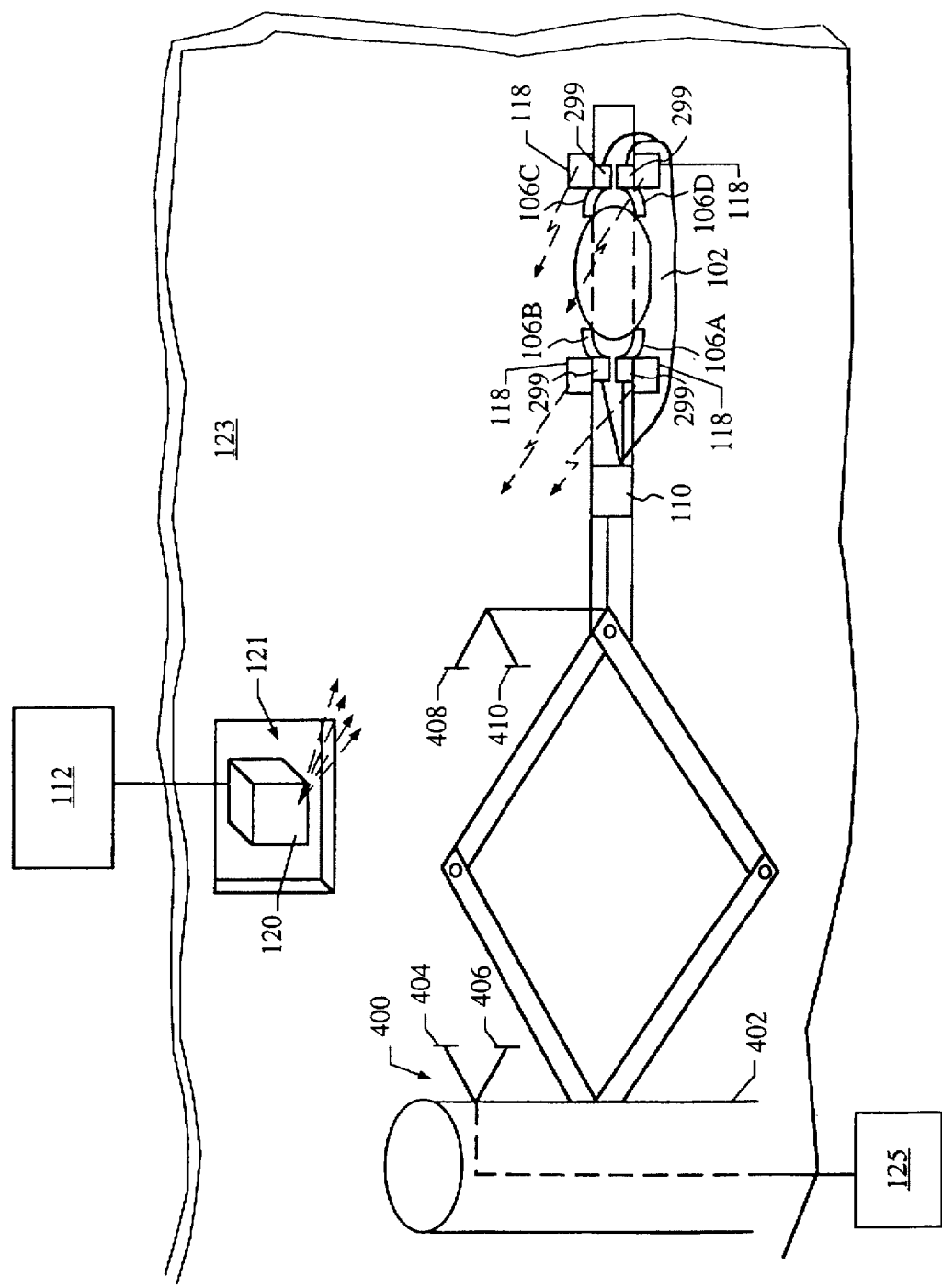
FIG. 10 is a partial perspective view of a wafer processing station including a wafer transport blade having a plurality of piezoelectric grippers according to an alternative embodiment of the present invention.

In the embodiment shown in FIG. 10, there is also shown a system for recharging the voltage source 110, where voltage source 110 may be a rechargeable battery or a storage capacitor. The recharging system comprises a docking station 400 which in one embodiment of the invention may be mounted on a conventional robotic transfer mechanism 402 and electrically coupled to a voltage supply 125 located externally of the processing station. The docking station includes a first pair of electrically conductive contacts 404 and 406 extending toward the blade 100, which first pair of contacts are provided for mating with a second pair of contacts 408 and 410 extending from the blade. The second pair of contacts are electrically coupled to the voltage source 110. In operation, when a blade is in a retracted position, the second pair of contacts 408 and 410 mate with respective ones of the first pair of contacts 404 and 406 to allow voltage from the docking station 400 to be stored in the voltage source 110, thus recharging the voltage source 110. In a preferred embodiment, the docking station may rotate with the blade 100 as the blade moves between the various processing chambers so that the second pair of contacts 408 and 410 are in continuous rotational alignment with the first pair of contacts 404 and 406 of the docking station 400. It is understood that the docking station shown in FIG. 10 may be used with the various embodiments of the present invention described herein.

Figure 11A:
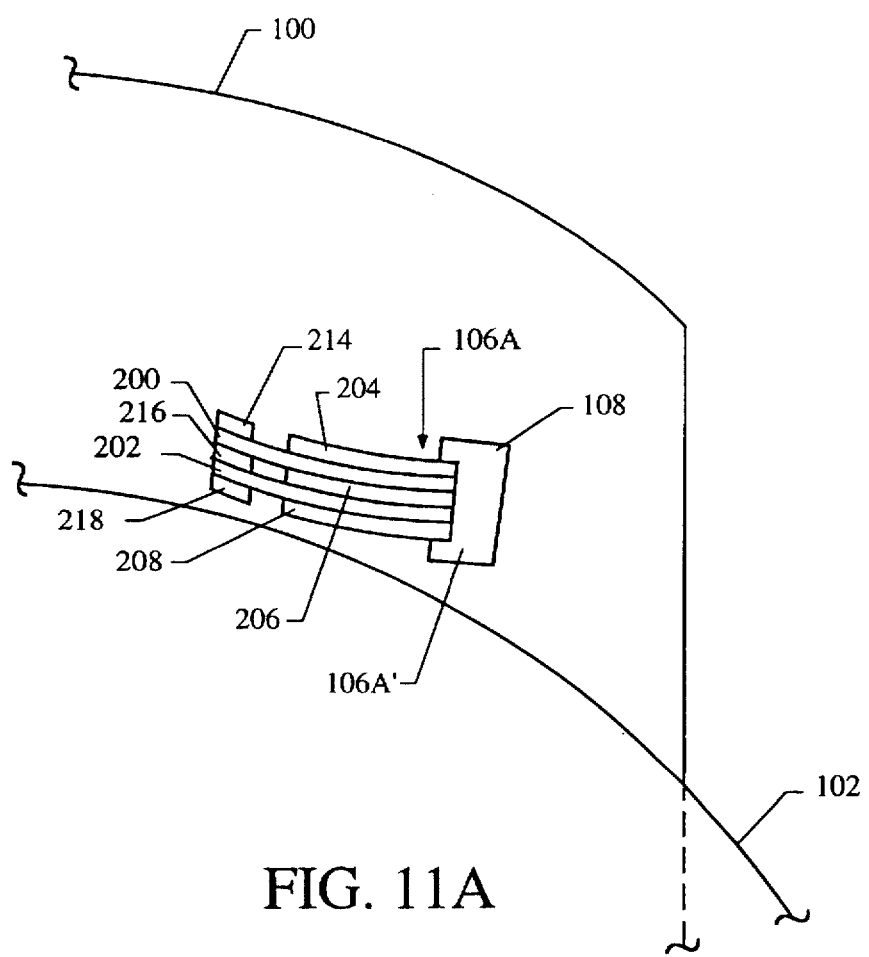
FIG. 11A is partial top view of a piezoelectric gripper according to an alternative embodiment of the present invention in a first state where it is not gripping a wafer.
Figure 11B:
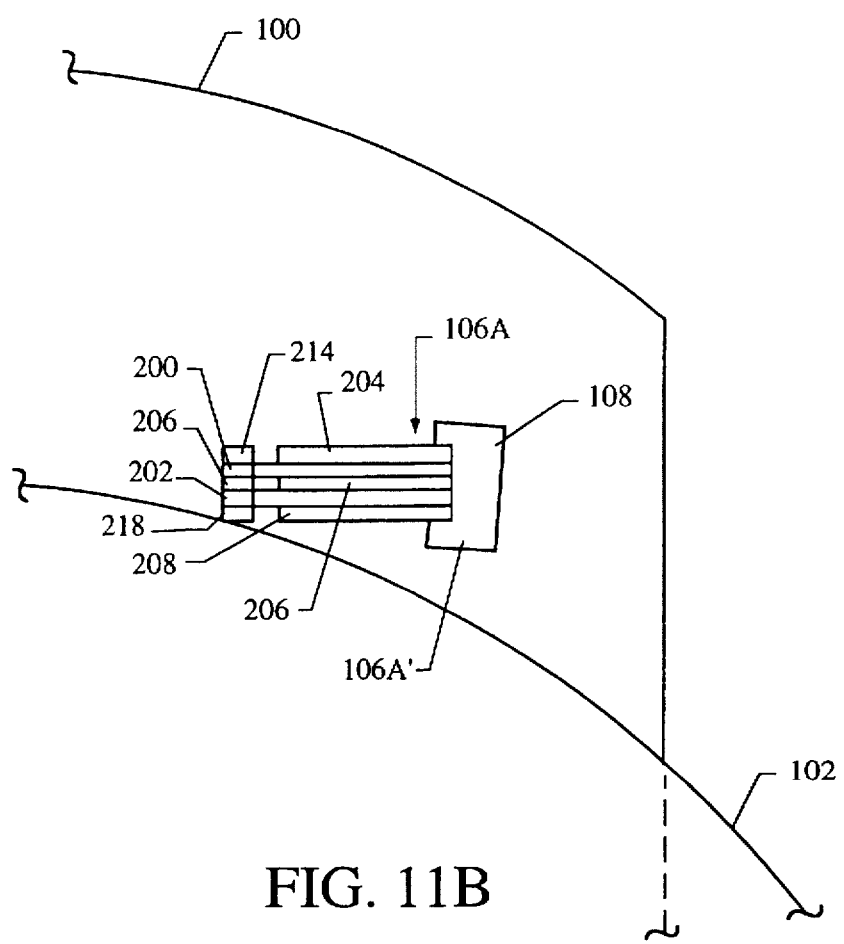
FIG. 11B is a partial top view of a piezoelectric gripper according to an alternative embodiment of the present invention in a second state in contact with a wafer.

A further alternative embodiment of the invention is shown in FIGS. 11A and 11B, again referring to gripper 106a as representative of all of the other grippers. The gripper 106a in the embodiment of FIGS. 11A and 11B is energized by the voltage source when the wafer is initially seated on the blade, such that the gripper 106a is initially bent away from the wafer 102 when the wafer is seated on the blade. Once the wafer is in proper position, the voltage in this embodiment is dissipated so that the gripper moves toward the wafer 102 as it relaxes. The direction of bending of the gripper may be reversed relative to the embodiment shown in FIGS. 7 and 8 by reversing the voltage applied to the electrode layers 204 and 208 with respect to that shown in FIG. 9. Alternatively, the voltage applied to the electrode layers 204 and 208 may be as shown in FIG. 9, but the polarization vectors within the layers 200, 202 may be reversed relative to those shown in FIG. 7C. In the embodiment of FIG. 11A, the voltage may be dissipated by decrementing the voltage control signal explained above with respect to FIG. 9. Once the grippers contact the wafer, the sensor layers 214, 216, 218 of the grippers generate a signal, as explained above with respect to FIG. 9, to stop further relaxation of the gripper until each of the other grippers are also in contact with the wafer. Thereafter, the voltage to each gripper may be further decreased by a predetermined amount as set forth in step 1306 of the flow chart shown in FIG. 13 to firmly secure the wafer on the blade.

Figure 14:
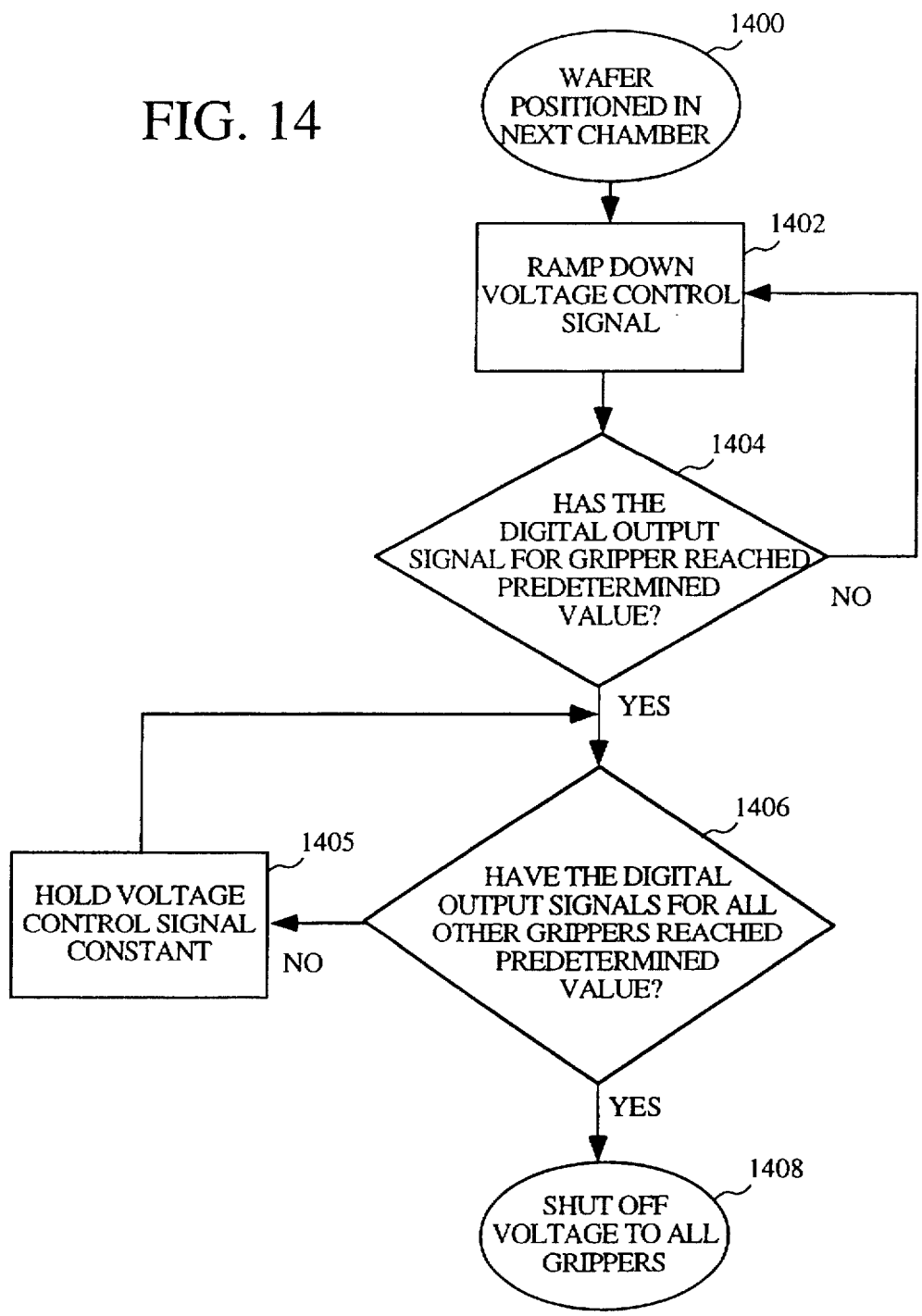
FIG. 14 is a flow chart showing the operation of a piezoelectric gripper to un-grip a wafer according to the present invention.

As would be appreciated by those skilled in the art, the grippers shown in the embodiments of FIGS. 11A and 11B may release the wafer according to flow charts shown in FIGS. 14 and 15, with the understanding that the voltage control signals and the digital output signals in this embodiment increase instead of decrease.

In another alternative embodiment of the invention, the grippers may operate to move inward and contact the wafer 102 as described above with respect to FIGS. 7 and 8, but the step 1306 (FIG. 13) of incrementing the voltage to each of the grippers after contact by all grippers may be omitted. In this alternative embodiment, movement by the wafer is prevented, or blocked, by the grippers without the grippers exerting an appreciable force on the wafer, i.e., as close as possible to $v_1$ shown on FIG. 12. With the grippers blocking the wafer, a wafer may attempt to move relative to the blade 100 when the blade accelerates during wafer transport on the blade. As such movement of the wafer relative to the blade occurs, the wafer will exert a greater force on one or more of the grippers 106a–d. To the extent that this force is exerted on a particular gripper, for example gripper 106b, a voltage will be generated in the piezoelectric layers 200, 202 of gripper 106b, which voltage is sensed by the sensor layers 214, 216, 218 of gripper 106b and communicated to the computer 112 as described above. In response, the computer 112 in this embodiment will increase the value of the voltage control signal to thereby increase the force of gripper 106b on the wafer by an amount proportional to the voltage sensed by sensor 212. The increased force of the gripper on the wafer will be equal and opposite to the increased force exerted by the wafer on the gripper due to the blade acceleration. Thus, further movement of the wafer on the blade is prevented. While it is understood that some initial movement of the wafer with respect to the blade will occur in this embodiment before the grippers exert a counter force to prevent further movement, this initial movement will be minimal due to the extreme sensitivity of the piezoelectric materials within the grippers.

In the embodiment described in the previous paragraph where the grippers merely block the wafer from movement, the forces on the wafer due to acceleration of the wafer are measured by the sensor layers 214, 216, and 218. However, the mass of each of the wafers is known, and the acceleration of the wafer on a blade during transport is controlled and known by the computer 112. Therefore, the forces generated on the wafer due to acceleration of the wafer during transport may be determined by the computer 112 independent of the sensor layers 214, 216, and 218. Thus, in a further alternative embodiment, upon determination of the forces on the wafer by the computer 112, a voltage may be applied to one or more of the grippers 106a–d to counter the forces on the wafer as described above.

In these alternative embodiments where the grippers merely block the wafers, once a wafer has been delivered into the next processing chamber, the voltage to each of the grippers may simply be shut off so that each of the grippers returns to a relaxed state clear of the wafer.

The grippers 106a–d have thus far been described as bimorphs with two piezoelectric ceramic layers interspersed between three electrode layers. However, it is understood that other shape-changing structures that change their shape without one member moving in rubbing contact with another member may be used to grip the wafer 102 according to the present invention. For example, each of the grippers 106a–d may comprise a piezoelectric element having polarization vectors oriented so that the element will elongate toward the wafer 102 upon application of the source voltage, and will also generate a voltage upon contact with the wafer 102 that may be used to indicate contact between the wafer 102 and the element It is further understood that the grippers may be formed of any of several other piezoelectric actuators that may be mounted on the blade 100 to move toward and engage the wafer 102, and also to generate a voltage signal upon engaging the wafer. Such piezoelectric actuators are, for example, manufactured by Physik Instrumente (PI) GmbH & Co. of Waldbronn, Germany. It is also understood that these piezoelectric actuators may be formed of a combination of a piezoelectric material mounted to a non-piezoelectric material. As is known in the art, such combination piezoelectric actuators operate by orienting the piezoelectric material within the non-piezoelectric material in such a way that, upon movement of the piezoelectric material due to the application of a source voltage, the piezoelectric material creates stresses in the non-piezoelectric material that cause the non-piezoelectric material to move over a greater range than that possible by the piezoelectric material by itself.

In further embodiments of the present invention, a gripper may be comprised of a bimetal having two metallic layers separated by an electrical and thermal insulator. In this embodiment, a first layer of the bimetal may be heated to a greater degree than the second layer, as for example by applying a voltage to the first layer, so that thermal expansion causes the first layer to elongate more than the second layer. The result of the uneven thermal expansion of the two layers is that the bimetal bends. The degree to which the bimetal bends may be controlled by the amount of voltage applied to the bimetal. The metallic layers may alternatively be formed of two metals having different coefficients of thermal expansion A strain gage may be provided at the end of the bimetal adjacent the wafer to sense contact between the bimetal and the wafer.

As stated in the Background of the Invention section and as shown on FIG. 11, a drawback to conventional transfer blades, including a depression 34, is that a wafer may be unevenly seated within the depression 34. The piezoelectric grippers according to the present invention firmly hold a wafer with respect to a transfer blade, thereby allowing the depression 34 to be omitted.

As further described in the Background of the Invention section, a semiconductor wafer is transferred to an orienting chamber during the wafer fabrication process to electronically determine the location of the center of the wafer and to orient the wafer. However, according to the present invention, as the location of each of the piezoelectric grippers 106a–d is known with respect to the blade 102, and as the distance each of the piezoelectric grippers 106a–d elongated may be determined by the computer 112, the precise location of the wafer 102 with respect to the blade 100 may be computed in the computer 112 by triangulation. From that computation, the center of the semiconductor wafer 102 may be determined. Thus, the step of computing the center of a wafer within the orienting chamber may be omitted, further reducing the overall wafer fabrication time and cost.

A feature of the present invention is that motion is obtained, i. e., movement of the grippers 106a–d inward to grip the wafer, without relative frictional motion between two members in contact with each other. As discussed in the Background of the Invention section, such relative frictional motion between two members in contact generates contaminating particulates which adversely affect wafer fabrication.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

I claim:

1. In a processing station having one or more process chambers for processing successively supplied workpieces under essentially contaminant-free conditions, an apparatus for moving said workpieces between chambers, said apparatus comprising:

(a) a robotic arm for supporting each said workpiece and for moving each said workpiece between said chambers;

(b) a plurality of shape-changing grippers each being mounted to the robotic arm and each being respectively capable of changing shape in response to a respectively supplied energizing signal without causing frictional rubbing together of surfaces, wherein said changing of shape of each respective gripper can cause the respective gripper to engage and disengage with a corresponding grippable point of the workpiece, wherein at least two of said shape-changing grippers define an opposed set of grippers that, when forcibly engaged with the workpiece, grip the workpiece and thereby resist movement of the workpiece; and (c) a control mechanism, operatively coupled to the shape-changing grippers, for individually controlling the respective energizing signal supplied to each respective gripper of said opposed set of grippers so as to enable independent switching of each respective one of the opposed grippers between an unengaged first state wherein the workpiece can be moved with essentially no resistance from the respective gripper of said opposed set, and an engaged second state wherein the workpiece cannot be freely moved without encountering resistance from the respective gripper of said opposed set;

(c.1) wherein said control mechanism includes a slight contact mechanism for switching each of the shape-changing grippers of the opposed set between said unengaged first state and said engaged second state without thereby causing substantial movement of the workpiece.

2. The apparatus of claim 1 wherein said robotic arm includes:

(a.1) a reciprocating member for moving said workpieces in and out of each respective chamber.

3. The apparatus of claim 2 wherein said robotic arm includes:

(a.2) a rotating member for moving said workpieces from one chamber to a next chamber.

4. A system for transporting a semiconductor wafer having a lower surface and an outer circumference, said system comprising:

(a) a moveable blade for supporting the lower surface of the semiconductor wafer;

17

(b) a plurality of piezoelectric grippers mounted to the blade for engaging with the outer circumference of the semiconductor wafer so as to hold the semiconductor wafer on the blades; and (c) a controllable voltage source for supplying a variable voltage to a first piezoelectric gripper of said plurality of piezoelectric grippers and for thereby moving a portion of said first piezoelectric gripper, independently of others of said plurality of piezoelectric grippers, between a first position not in engagement with said outer circumference of the semiconductor wafer and a second position in slight engagement with said outer circumference of the semiconductor wafer and for maintaining said second position of slight engagement, (c.1) wherein said transition to the second position and said slight engagement with the outer circumference do not cause frictional movement between the wafer and the blade.

5. A system for gripping a semiconductor wafer as recited in claim 4, further comprising:

(d) sensing means for sensing said slight engagement of said piezoelectric gripper with the outer circumference; and (e) control means, operatively coupled to the sensing means and to the controllable voltage source, for responsively stopping further advancing movement of said portion of the first piezoelectric gripper toward the outer circumference upon said sensing means sensing said slight engagement.

6. A system for gripping a semiconductor wafer as recited in claim 5, wherein the control means further comprises:

(e.1) grip incrementing means for increasing said variable voltage by a predetermined amount after the second position of slight engagement is attained by the first gripper and after each other of said plurality of piezoelectric grippers has come into corresponding slight engagement with said outer circumference of the semiconductor wafers.

7. A system for gripping a semiconductor wafer as recited in claim 4, wherein said controllable voltage source includes digital means for changing said voltage supplied to said first piezoelectric gripper incrementally.

8. A system for gripping a semiconductor wafer as recited in claim 4, wherein said controllable voltage source includes:

(c.1) energy storage means supported on the moveable blade.

9. A system for gripping a semiconductor wafer as recited in claim 8, wherein said energy storage means is rechargeable and further includes:

(c.1a) a recharging coupling for recharging said energy storage means.

10. A system for gripping a semiconductor wafer as recited in claim 9, wherein said energy storage means includes:

(c.1b) a storage capacitor.

11. A system for gripping a semiconductor wafer as recited in claim 4, wherein said controllable voltage source includes:

(c.1) a remote control interface for receiving control signals from a remote controller.

12. A system for gripping a semiconductor wafer as recited in claim 11, wherein said control signals include optical signals.

18

13. A system for gripping a semiconductor wafer, comprising:

(a) blade means for supporting the semiconductor wafer;

(b) a plurality of three or more grippers for engaging the semiconductor wafer around an outer circumference of the semiconductor wafer;

(c) a plurality of three or more respective support blocks mounted to the blade means, each for supporting a respective one of said plurality of grippers in spaced-apart relation to said blade means;

(d) individual control means for moving each of said three or more grippers individually toward the semiconductor wafer; and (e) halt means for stopping said individual movement of said each gripper upon initial contact of said each gripper with the semiconductor wafers.

14. A gripping system according to claim 13 wherein said movement of said each gripper toward the semiconductor wafer occurs without frictional movement between any of said grippers and said support blocks.

15. A method of gripping a semiconductor wafer, comprising the steps of:

(a) positioning the wafer between a plurality of piezoelectric grippers;

(b) individually deforming each of the plurality of grippers toward contact with the semiconductor wafer by individually applying a respectively incrementing voltage to each respective one of the piezoelectric grippers;

(c) individually sensing when a respective individual piezoelectric gripper of the plurality of piezoelectric grippers initially contacts the outer circumference of the semiconductor wafer as a result of said step (b) of individually deforming;

(d) in response to said sensing of initial contact by a respective individual piezoelectric gripper, maintaining the respective voltage of the respective individual piezoelectric gripper at the voltage at which the piezoelectric gripper initially contacted the outer circumference of the semiconductor wafer; and (e) after sensing initial contact by all said grippers, increasing the respective voltage applied to each of the plurality of piezoelectric grippers by a predetermined voltage.

16. A gripping method according to claim 15 wherein said plurality of piezoelectric grippers comprises at least three such grippers.

17. The gripping method of claim 15 wherein said wafer is symmetrically grippable about its outer circumference, and wherein said plurality of piezoelectric grippers are distributed to symmetrically grip the wafer about its outer circumference such that said step (e) results in symmetric securing of the wafer by said grippers.

18. A method for nonfrictionally securing a workpiece to a robotic transport surface, where a plurality of shape-changing grippers are distributed on the transport surface for securely gripping the workpiece to the transport surface, where the workpiece is positioned on the transport surface so as to be initially spaced apart from said shape-changing grippers and where the workpiece is initially movable frictionally on said surface, the method comprising the steps of:

(a) beginning deformation of each of the grippers toward respective initial contact with the workpiece;

(b) for each respective gripper, first determining if the respective gripper has made initial contact with the workpiece as a result of said begun deformation;

(c) for all grippers that are to secure the workpiece, second determining if all such grippers have made initial contact with the workpiece; and (d) in response to said first and second determining steps, (b) and (c), halting [1305] the begun deformation of those of the respective grippers which are determined by said step (b) to have made initial contact with the workpiece if it is not determined by said second determining step (c) that all such grippers have made initial contact with the workpiece.

19. The workpiece securing method of claim 18 wherein:

(a.1) said at least three individually deformable grippers - each includes a piezoelectric multi-morph to which a deformation-causing voltage can be applied; and (a.2) said step of beginning deformation includes supplying a respective deformation-causing voltage of incrementally increasing magnitude to each respective gripper.

20. The workpiece securing method of claim 19 wherein:

(a.2a) said step of supplying a respective deformation-causing voltage of incrementally increasing magnitude includes digitally increasing said magnitude.

21. The workpiece securing method of claim 18 further comprising the step of:

(e) in response to a finding by said second determining step (c) that all such grippers have made initial contact with the workpiece, uniformly further deforming all such grippers so as to enhance their grip on the workpiece.

22. The workpiece securing method of claim 21 wherein said workpiece has a set of symmetrically-grippable points and said shape-changing grippers are symmetrically distributed on the transport surface for respectively gripping said set of symmetrically-grippable points.

23. A method for transporting a workpiece that is supported by a robotic transport surface, where a plurality of shape-changing grippers are distributed on the transport surface for securely gripping the workpiece to the transport surface, where the workpiece is positioned on the transport surface so as to be initially spaced apart from said shape-changing grippers and where the workpiece is initially movable frictionally on said surface, said method comprising the steps of:

(a) securing said workpiece to the robotic transport surface in accordance with claim 18; and (b) moving the combination of the robotic transport surface and secured workpiece at a first acceleration that is greater than a second acceleration, where said second acceleration is one where the workpiece would frictionally move against the transport surface if the workpiece were not secured by said grippers.

24. A method for transporting a workpiece according to claim 23, further comprising the steps of:

(c) during said moving at the first acceleration, sensing if one or more of said grippers is having a greater force exerted thereagainst by the accelerating workpiece as compared to others of the grippers; and (d) further deforming the one or more grippers experiencing the greater force so as to counteract the greater force exerted thereagainst by the accelerating workpiece.

25. The workpiece securing method of claim 18 wherein said grippers that are to secure the workpiece is constituted by at least three individually deformable grippers.

26. The workpiece securing method of claim 18 wherein:

(a.1) said at least three individually deformable grippers each includes a piezoelectric contact detector; and (b.1) said step of first determining if the respective gripper has made initial contact includes using the respective piezoelectric contact detector of a respective one of said at least three individually deformable grippers to detect initial contact with the workpiece.

27. A method for nonfrictionally unsecuring a workpiece from a robotic transport surface, where a plurality of shape-changing grippers are distributed on the transport surface for securely gripping the workpiece to the transport surface, where the workpiece is positioned on the transport surface so as to be initially gripped by said shape-changing grippers and where the workpiece is movable frictionally on said surface when free from the shape-changing grippers, the unsecuring method comprising the steps of:

(a) beginning deformation of each of the grippers toward respective last slight contact with the workpiece;

(b) for each respective gripper, first determining if the respective gripper has reached a predefined state of last slight contact with the workpiece as a result of said begun deformation;

(c) for all grippers that secured the workpiece, second determining if all such grippers have reached said predefined state of last slight contact with the workpiece; and (d) in response to said first and second determining steps, (b) and (c), halting the begun deformation of those of the respective grippers which are determined by said step (b) to have reached said predefined state of last slight contact with the workpiece if it is not determined by said second determining step (c) that all such grippers have reached said predefined state of last slight contact with the workpiece.

28. The workpiece unsecuring method of claim 27 wherein said grippers that secured the workpiece is constituted by at least three individually deformable grippers.

29. The workpiece unsecuring method of claim 28 wherein:

(a.1) said at least three individually deformable grippers each includes a piezoelectric multi-morph to which a deformation-causing voltage can be applied; and (a.2) said step of beginning deformation includes supplying a respective deformation-causing voltage of incrementally decreasing magnitude to each respective gripper.

30. The workpiece unsecuring method of claim 27 further comprising the step of:

(e) in response to a finding by said second determining step (c) that all such grippers have reached said predefined state of last slight contact with the workpiece, uniformly further deforming all such grippers so as to free the workpiece.

31. A method for nonfrictionally unsecuring a workpiece from a robotic transport surface, where a plurality of shape-changing grippers are distributed on the transport surface for securely gripping the workpiece to the transport surface, where the workpiece is positioned on the transport surface so as to be initially gripped by said shape-changing grippers and where the workpiece is movable frictionally on said surface when free from the shape-changing grippers, the unsecuring method comprising the steps of:

(a) beginning deformation of each of the grippers toward respective last slight contact with the workpiece;

(b) for each respective gripper, first determining if a force exerted by the respective gripper against the workpiece is different from a next closest of force exerted by another of the grippers by more than a predefined amount, and if so halting the begun deformation of the respective gripper until the force difference no longer exceeds said predefined amount;

(c) for each respective gripper, second determining if the respective gripper has reached a predefined state of last slight contact with the workpiece;

(d) for all grippers that secured the workpiece, third determining if all such grippers have reached said predefined state of last slight contact with the workpiece; and (e) in response to said second and third determining steps, (c) and (d), halting the deformation of those of the respective grippers which are determined by said step (c) to have reached said predefined state of last slight contact with the workpiece if it is not determined by said third determining step (d) that all such grippers have reached said predefined state of last slight contact with the workpiece.

32. The workpiece unsecuring method of claim 31 further comprising the step of:

(f) in response to a finding by said third determining step (d) that all such grippers have reached said predefined state of last slight contact with the workpiece, uniformly further deforming all such grippers so as to free the workpiece.

33. A method for transporting a workpiece that is supported by a robotic transport surface, where a plurality of shape-changing grippers are distributed on the transport surface for securely gripping the workpiece to the transport surface, where the workpiece is positioned on the transport surface so as to be securely gripped by said shape-changing grippers and where the workpiece is movable frictionally on said surface when free of said grippers, said method comprising the steps of:

(a) moving the combination of the robotic transport surface and secured workpiece, wherein said moving step includes a first deceleration that is greater than a second deceleration, where said second deceleration is one where the workpiece would frictionally move against the transport surface if the workpiece were not secured by said grippers; and (b) after said first deceleration, unsecuring said workpiece from the robotic transport surface in accordance with claim 27.

34. An apparatus for transporting a workpiece within an environment that is to be kept essentially free of contaminating particulates, wherein said workpiece has a supportable under-surface and a plurality of grippable points, the apparatus comprising:

(a) a moveable support piece for supporting said workpiece by its under-surface and for moving said workpiece within said environment;

(b) a plurality of shape-changing grippers each being mounted to the support piece and each being respectively capable of changing shape in response to a respectively supplied energizing signal without rubbing frictionally against the support piece, wherein said changing of shape of each respective gripper can cause the respective gripper to engage and disengage with a corresponding grippable point of the workpiece, wherein two or more of said shape-changing grippers define an opposed set of grippers that, when forcibly engaged with the workpiece, resist movement of the workpiece relative to the support piece; and (c) a control mechanism, operatively coupled to the shape-changing grippers, for individually controlling the respective energizing signal supplied to each respective gripper of said opposed set of grippers so as to enable independent switching of each respective one of the opposed grippers between an unengaged first state wherein the workpiece can be slid frictionally across the support piece with essentially no resistance from the respective gripper of said opposed set, and an engaged second state wherein the workpiece cannot be freely slid frictionally across the support piece without encountering resistance to such sliding from the respective gripper of said opposed set;

(c.1) wherein said control mechanism includes a slight contact mechanism for switching each of the shape-changing grippers of the opposed set between said unengaged first state and said engaged second state without causing frictional rubbing of the workpiece against the support piece.

35. A workpiece transporting apparatus according to claim 34 wherein:

(b.1) said plurality of shape-changing grippers are composed of one or more piezoelectric ceramic materials.

36. A workpiece transporting apparatus according to claim 35 wherein:

(b.1a) said piezoelectric ceramic materials are selected from the group of consisting of lead-zirconate-titanate compounds and lead-magnesium-niobate compounds.

37. A workpiece transporting apparatus according to claim 34 wherein:

(b.1) each of the shape-changing grippers of the opposed set includes a slight contact detector for detecting slight contact of the respective shape-changing gripper with a corresponding grippable point of the workpiece; and (c.1a) said slight contact mechanism is responsive to the slight contact detector of each of the shape-changing grippers of the opposed set.

38. A workpiece transporting apparatus according to claim 37 wherein:

(b.1a) the slight contact detector includes a piezoelectric sensing element that is electrically isolated from the energizing signal of the respective shape-changing gripper.

39. A workpiece transporting apparatus according to claim 34 wherein:

(a.1) said moveable support piece includes a reciprocating blade adapted to stablely support the workpiece by its under-surface and dimensioned to enable lifting of the workpiece off the blade by reciprocating lifters disposed in spaced-apart adjacency to the blade.

40. A workpiece transporting apparatus according to claim 34 wherein:

(a.1) said moveable support piece has a substantially planar support surface for engaging with the under-surface of the workpiece and thereby supporting the workpiece; and (b.1) said plurality of shape-changing grippers are each spaced-apart from and extend over the planar support surface.

41. A workpiece transporting apparatus according to claim 34 wherein:

(b.1) said plurality of shape-changing grippers are composed of out-gas free materials.

42. A workpiece transporting apparatus according to claim 35 wherein:

(b.1a) said plurality of shape-changing grippers include electrodes composed of nickel.

* * * * *